US011411172B2

United States Patent
Liu et al.

(10) Patent No.: US 11,411,172 B2
(45) Date of Patent: Aug. 9, 2022

(54) MAGNETOELECTRIC SPIN ORBIT LOGIC BASED FULL ADDER

(71) Applicant: Intel Corporation, Santa Clara, CA (US)

(72) Inventors: Huichu Liu, Santa Clara, CA (US); Sasikanth Manipatruni, Portland, OR (US); Daniel Morris, Hillsboro, OR (US); Kaushik Vaidyanathan, Santa Clara, CA (US); Tanay Karnik, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 16/130,912

(22) Filed: Sep. 13, 2018

(65) Prior Publication Data

US 2020/0091414 A1   Mar. 19, 2020

(51) Int. Cl.
*G11C 11/00* (2006.01)
*H01L 43/04* (2006.01)
(Continued)

(52) U.S. Cl.
CPC ........... *H01L 43/04* (2013.01); *G11C 11/161* (2013.01); *G11C 11/165* (2013.01); *G11C 11/18* (2013.01); *H01L 43/065* (2013.01); *H01L 43/10* (2013.01)

(58) Field of Classification Search
CPC ....... H01L 43/04; H01L 43/065; H01L 43/10; G11C 11/161; G11C 11/165; G11C 11/18
(Continued)

(56) References Cited

U.S. PATENT DOCUMENTS

2017/0346149 A1\* 11/2017 Ciubotaru ............... H01F 10/32
2020/0091407 A1    3/2020 Liu et al.
(Continued)

FOREIGN PATENT DOCUMENTS

WO    2019066820    4/2019

OTHER PUBLICATIONS

Kumar et al., "Single Bit Full Adder Design Using 8 Transistors with Novel 3 Transistors XNOR Gate", International Journal of VLSI Design & Communication Systems (VLSICS) vol. 2, No. 4, Dec. 2011.
(Continued)

*Primary Examiner* — Huan Hoang
(74) *Attorney, Agent, or Firm* — Essential Patents Group, LLP

(57) ABSTRACT

An apparatus is provided which comprises a full adder including magnetoelectric material and spin orbit material. In some embodiments, the adder includes: a 3-bit carry generation structure and a multi-bit sum generation structure coupled to the 3-bit carry generation structure. In some embodiments, the 3-bit carry generation structure includes at least three cells comprising magnetoelectric material and spin orbit material, wherein the 3-bit carry generation structure is to perform a minority logic operation on first, second, and third inputs to generate a carry output. In some embodiments, the multi-bit sum generation structure includes at least four cells comprising magnetoelectric material and spin orbit material, wherein the multi-bit sum generation structure is to perform a minority logic operation on the first, second, and third inputs and the carry output to generate a sum output.

23 Claims, 23 Drawing Sheets

(51) Int. Cl.
*H01L 43/06* (2006.01)
*G11C 11/16* (2006.01)
*G11C 11/18* (2006.01)
*H01L 43/10* (2006.01)

(58) Field of Classification Search
USPC ........................................................ 365/158
See application file for complete search history.

(56) References Cited

U.S. PATENT DOCUMENTS

| | | |
|---|---|---|
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

OTHER PUBLICATIONS

Manipatruni, S. et al., "Spin-Orbit Logic with Magnetoelectric Nodes: A Scalable Charge Mediated Nonvolatile Spintronic Logic", arXiv:1512.05428. 60 pages, last revised on Mar. 5, 2017.

Roohi et al., "A Tunable Majority Gate-Based Full Adder Using Current-Induced Domain Wall Nanomagnets", IEEE Transactions on Magnetics, vol. 53, No. 8, 2016.

Zhang et al., "A Method of Majority Logic Reduction for Quantum Cellular Automata", IEEE Transactions on Nanotechnology, vol. 3, No. 4, 2004.

Zhang et al., "Synthesis of Majority and Minority Networks and Its Applications to QCA, TPL and SET Based Nanotechnologies", VLSID '05.

\* cited by examiner

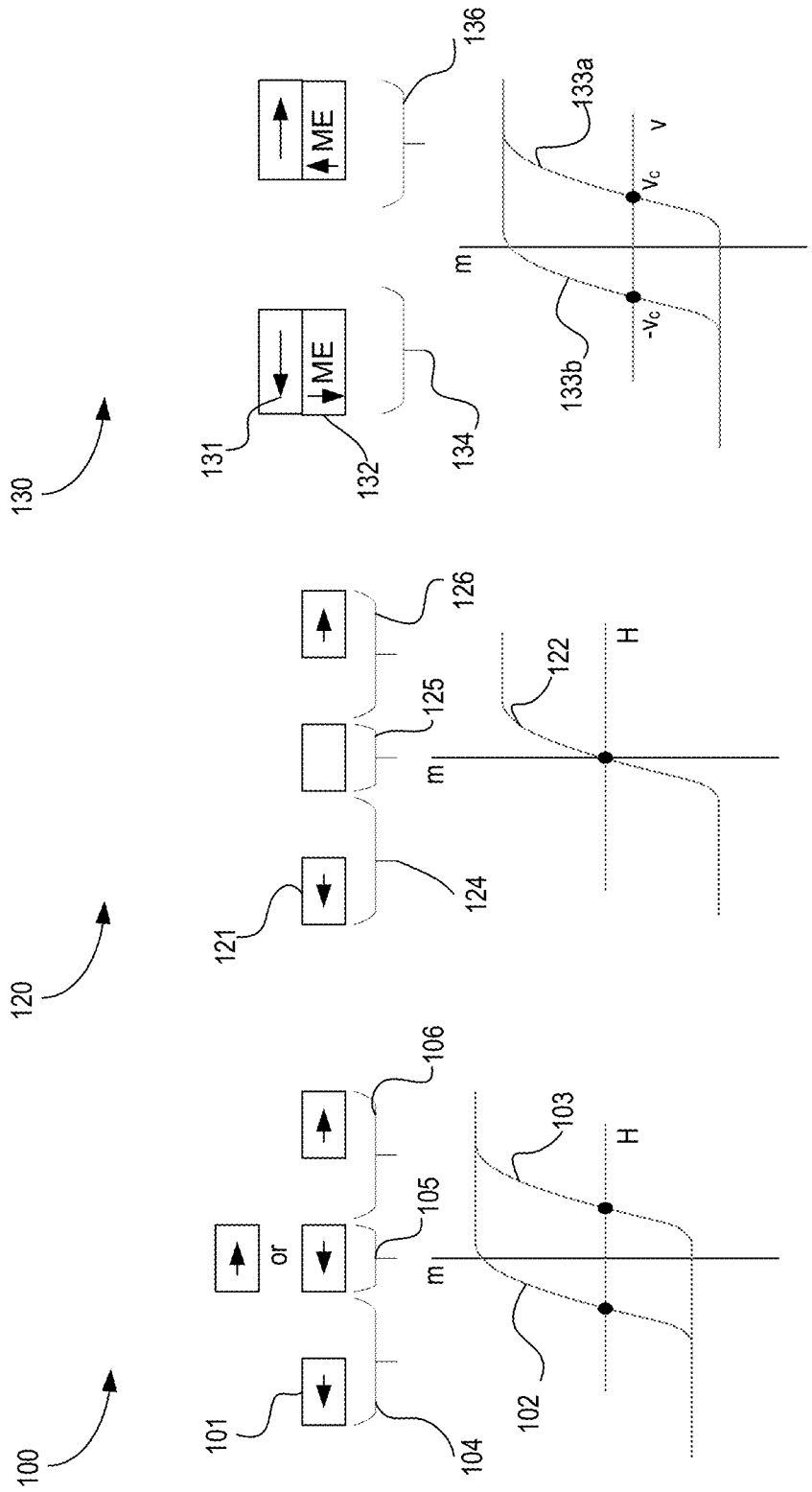

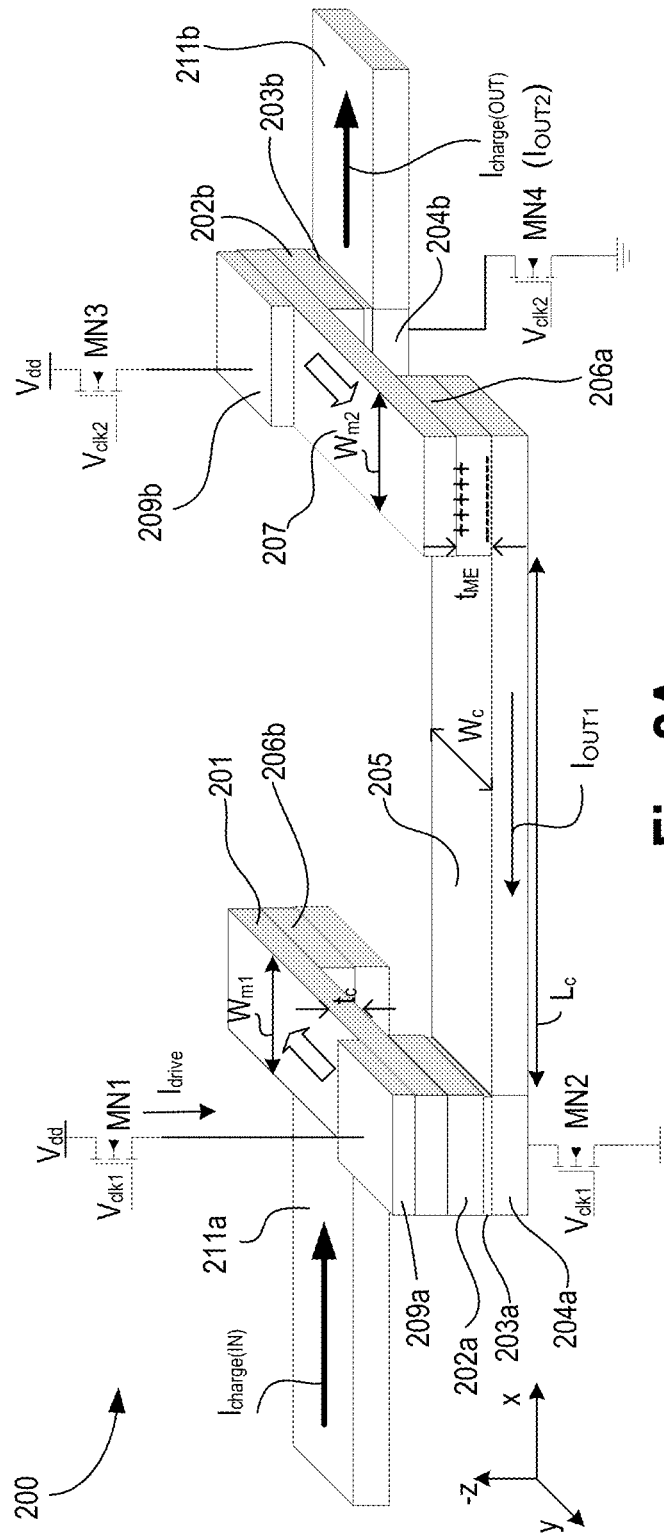
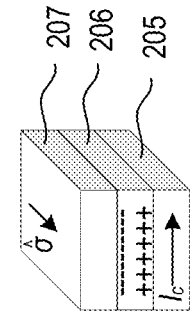
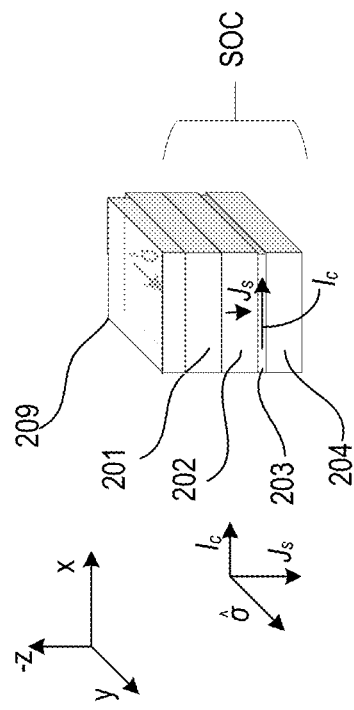
Fig. 2A
Fig. 2B
Fig. 2C

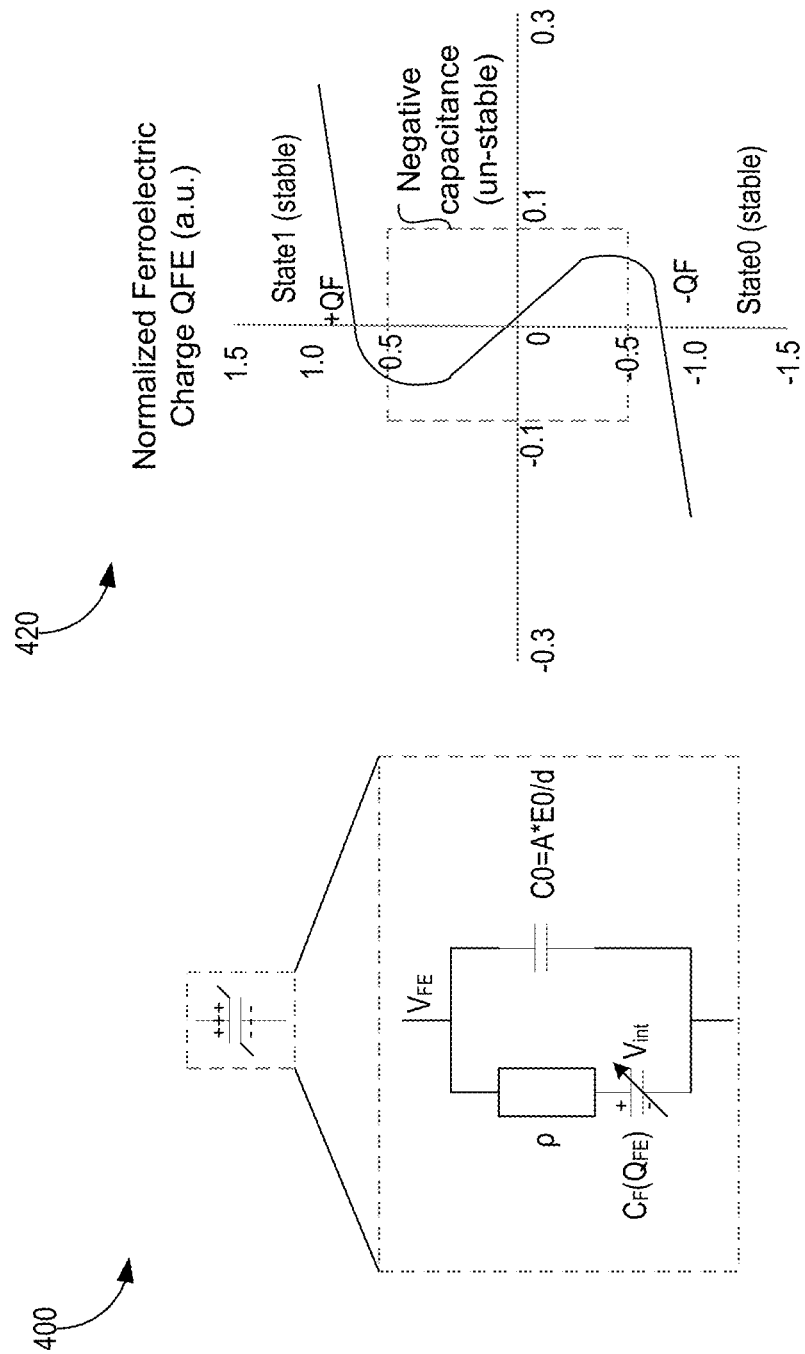

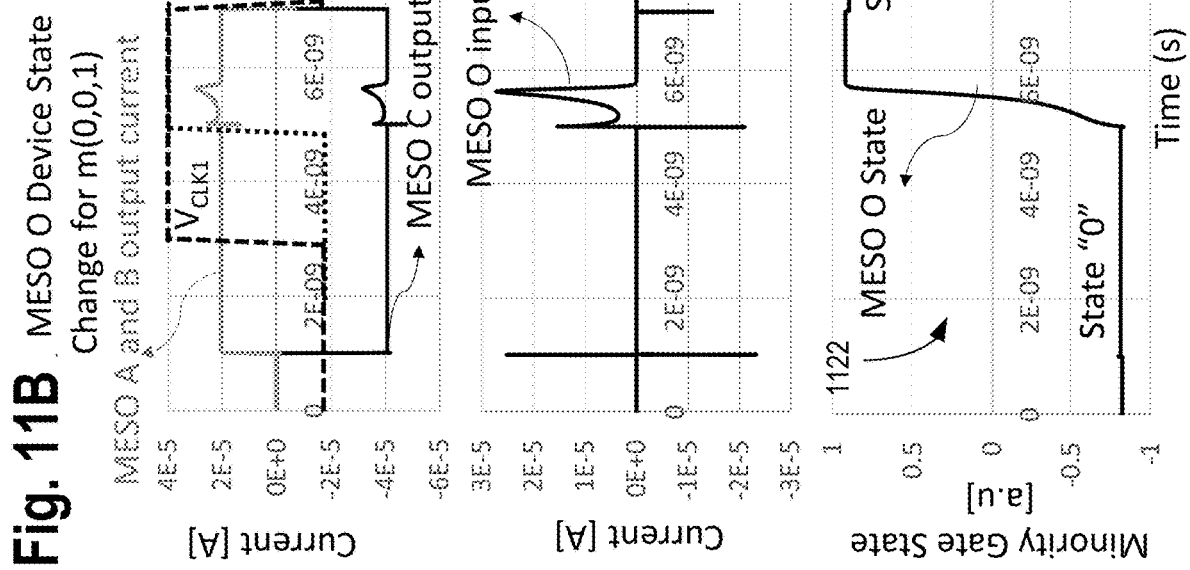
Fig. 11B MESO O Device State Change for m(0,0,1)
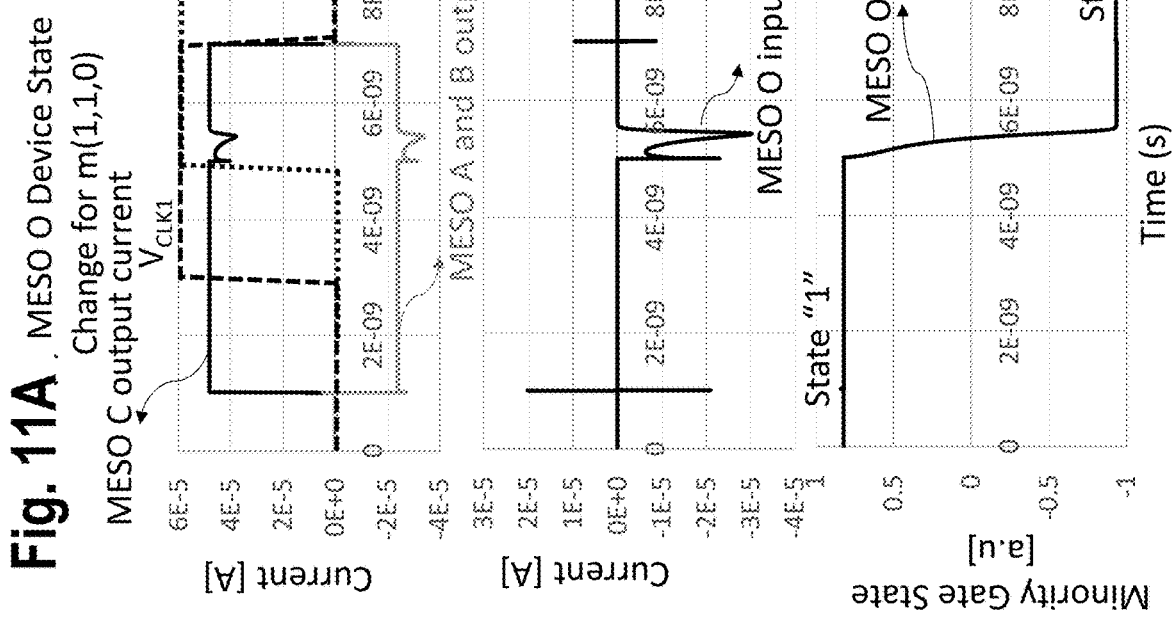
Fig. 11A MESO O Device State Change for m(1,1,0)

MAGNETOELECTRIC SPIN ORBIT LOGIC BASED FULL ADDER

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (e.g., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from high energy and relatively long switching times.

For example, large write current (e.g., greater than 100 µA/bit) and voltage (e.g., greater than 0.7 V) are needed to switch a magnet (i.e., to write data to the magnet) in Magnetic Tunnel Junctions (MTJs). Existing Magnetic Random Access Memory (MRAM) based on MTJs also suffer from high write error rates (WERs) or low speed switching. For example, to achieve lower WERs, switching time is slowed down which degrades the performance of the MRAM. MTJ based MRAMs also suffer from reliability issues due to tunneling current in the spin filtering tunneling dielectric of the MTJs e.g., magnesium oxide (MgO). An arithmetic logic unit (ALU) is a useful block for any logic function, where a full adder (FA) is a common logic block. Conventional 1-bit Complementary Metal Oxide Semiconductor (CMOS) adder may require eight to twenty-eight transistors. Scaling the adder design in area and power is a challenge. The same challenge exists in current spintronic logic.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to an applied magnetic field for a ferromagnet.

FIG. 1B illustrates a magnetization response to an applied magnetic field for a paramagnet.

FIG. 1C illustrates a magnetization response to an applied voltage field for a paramagnet connected to a magnetoelectric layer.

FIG. 2A illustrates a unidirectional magnetoelectric spin orbit (MESO) logic, according to some embodiments of the disclosure.

FIG. 2B illustrates a spin orbit material stack at the input of an interconnect, according to some embodiments of the disclosure.

FIG. 2C illustrates a magnetoelectric material stack at the output of an interconnect, according to some embodiments of the disclosure.

FIGS. 4A-B illustrate a ferroelectric Landau Khalatnikov (LK) model and corresponding plot showing two ferroelectric states.

FIGS. 11A-B illustrate plots showing simulations of MESO minority gate device of FIG. 10 having ideal current sources, in accordance with some embodiments.

DETAILED DESCRIPTION

Figure 3A:
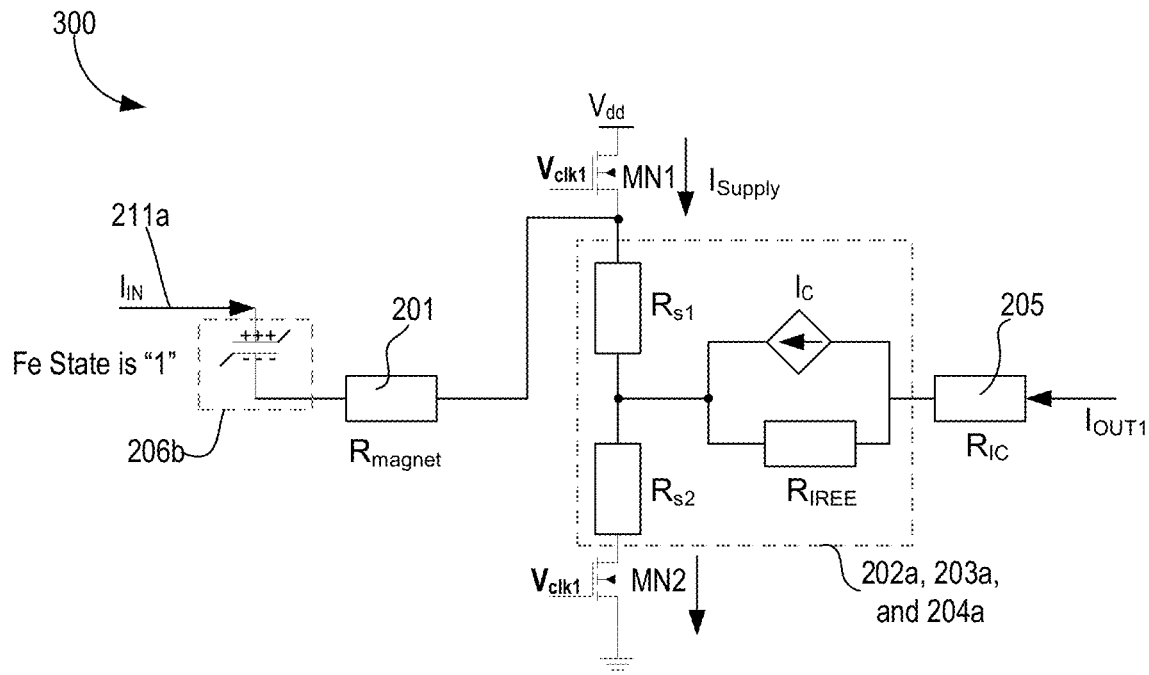
FIG. 3A illustrates an equivalent circuit model for a first section (e.g., input section) of the unidirectional MESO logic of FIG. 2A, in accordance with some embodiments.

Complementary Metal Oxide Semiconductor (CMOS) majority/minority gate based logic design results in increased gate count due to the logic inefficiency using CMOS for majority/minority function. Using novel spin or quantum devices (e.g. quantum cellular automata (QCA), tunneling phase logic (TPL), and single electron tunneling (SET) has shown gate reduction compared to conventional CMOS circuits due to the retaliating of majority/minority function within a few devices. The nano-magnet based 1-bit adder uses 2 magnetic tunneling junction-nanowire (MTJ-nanowire) devices for minority gate operation but it requires additional CMOS based circuits with sixteen transistors for two sense amplifiers with additional two reference MTJs for pre-charge. The nano-magnet based 1-bit adder also uses an inverter for the carry-out to the 5-input majority gate, besides additional peripheral circuits and MTJs for the current input generation to the adder. While QCA is designed with less transistor assistance, but it requires five cells for one 3-input majority gate and over 80 devices for complete function and additional transistors for clocking signal generation.

Technology scaling is an important factor of success for the semiconductor industry, where beyond CMOS (Complementary Metal Oxide Semiconductor) technology is being considered to enable future technology scaling below 5 nm technology node. One beyond CMOS technology employs Magnetoelectric (ME) effect. The ME effect has the ability to manipulate the magnetization (and the associated spin of electrons in the material) by an applied electric field. Since an estimated energy dissipation per unit area per magnet switching event through the ME effect is an order of magnitude smaller than with spin-transfer torque (STT) effect, ME materials have the capability for next-generation memory and logic applications.

Magnetoelectric Spin Orbit (MESO) Logic devices/gates when cascaded with one another may suffer from back propagation of signals that may switch magnets unintentionally. Various embodiments describe a MESO Logic which is a combination of various physical phenomena for spin-to-charge and charge-to-spin conversion, where the MESO logic comprises an input magnet and stack of layers for spin-to-charge conversion. Spin-to-charge conversion is achieved via one or more layers with the inverse Rashba-Edelstein effect (or spin Hall effect) wherein a spin current injected from the input magnet produces a charge current. The sign of the charge current is determined by the direction of the injected spin and thus of magnetization. In some embodiments, charge-to-spin conversion is achieved via magnetoelectric effect in which the charge current produces a voltage on a capacitor, comprising a layer with magnetoelectric effect, leading to switching magnetization of an output magnet. In some embodiments, magnetic response of a magnet is according to an applied exchange bias from the magnetoelectric effect.

In some embodiments, a multi-phase clock is used with transistors to cascade multiple MESO logic devices. For example, a 3-phase clock is used to prevent back propagation of current from the output magnet to towards the input magnet. In some embodiments, the clocks control the power supply of each MESO logic/device. For example, when clock phase is low, power supply is coupled to the magnet of the MESO logic/device. In some embodiments, merely two series connected MESO devices conduct while other MESO devices in the cascaded logic are prevented from conducting. As such, unidirectionality for signal propagation is achieved in the cascaded MESO logic. Further, backward propagation of current and leakage current is prevented by the transistors controlled by the multi-phase clock.

MESO logic gate is used to build MESO logic function as well as MESO based computing systems (since a computing system design requires complex logic functions). Some embodiments describe a MESO based full adder design which uses one 3-input MESO gate for 1-bit carry generation and one 5-input MESO gate for 1-bit sum generation. A 3-phase clocking is used for the input stage synchronization using n-type transistors (e.g., NMOS). Some embodiments use three or four MESO devices per bit generation in ripple carry adder design and use two n-type transistors per gate for clocking (e.g., for synchronized operation).

There are many technical effects of various embodiments. For example, high speed operation of the logic (e.g., 100 picoseconds (ps)) is achieved via the use of magnetoelectric switching operating on semi-insulating nanomagnets. In some examples, switching energy is reduced (e.g., 1-10 attojoules (aJ)) because the current needs to be "on" for a shorter time (e.g., approximately 3 ps) in order to charge the capacitor. In some examples, in contrast to the spin current, here charge current does not attenuate when it flows through an interconnect. Compared to traditional CMOS full adders, the MESO based 1-bit adder design of various embodiments uses MESO minority gates and shows gate count reduction. Also, since all MESO logic is non-volatile, it can additionally be employed as non-volatile logic to achieve ultra-low idle power consumption and efficient power management in integrated circuits. Moreover, MESO is a low voltage device which can operate at 100 mV with aJ class switching energy, offering promising path for future technology scaling and energy efficiency benefits. Other technical effects will be evident from various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/−20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described, but are not limited to such.

FIG. 1A illustrates a magnetization hysteresis plot 100 for ferromagnet 101. The plot shows magnetization response to applied magnetic field for ferromagnet 101. The x-axis of plot 100 is magnetic field 'H' while the y-axis is magnetization 'm'. For ferromagnet (FM) 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetizations. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103. Semi-insulating or insulating magnets also have a hysteresis curve, and can be used as magnets in various embodiments.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetro-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

FIG. 1B illustrates magnetization plot 120 for paramagnet 121. Plot 120 shows the magnetization response to applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$(Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

FIG. 1C illustrates plot 130 showing magnetization response to applied voltage field for a paramagnet 131 connected to a magnetoelectric layer 132. Here, the x-axis is voltage 'V' applied across ME layer 132 and y-axis is magnetization 'm'. Ferroelectric polarization '$P_{FE}$' is in ME layer 132 as indicated by an arrow. In this example, magnetization is driven by exchange bias exerted by a ME effect from ME layer 132. When positive voltage is applied to ME layer 132, paramagnet 131 establishes a deterministic magnetization (e.g., in the +x direction by voltage $+V_c$) as shown by configuration 136. When negative voltage is applied by ME layer 132, paramagnet 131 establishes a deterministic magnetization (e.g., in the −x direction by voltage $-V_c$) as shown by configuration 134. Plot 130 shows that magnetization functions 133a and 133b have hysteresis. In some embodiments, by combining ME layer 132 with paramagnet 131, switching speeds of paramagnet as shown in FIG. 1B are achieved. In some embodiments, the hysteresis behavior of FM 131, as shown in FIG. 1C, is associated with the driving force of switching rather than the intrinsic resistance of the magnet to switching.

FIG. 2A illustrates a unidirectional magnetoelectric spin orbit (MESO) logic, according to some embodiments of the disclosure. FIG. 2B illustrates a material stack at the input of an interconnect, according to some embodiments of the disclosure. FIG. 2C illustrates a magnetoelectric material stack at the output of an interconnect, according to some embodiments of the disclosure. It is pointed out that those elements of FIGS. 2A-C having the same reference numbers (or names) as the elements of any other figure can operate or function in any manner similar to that described, but are not limited to such.

In some embodiments, MESO logic 200 comprises a first magnet 201, a stack of layers (e.g., layers 202, 203, and 204, also labeled as 202a/b, 203a/b, and 204a/b), interconnecting conductor 205 (e.g., a non-magnetic charge conductor), magnetoelectric (ME) layer 206 (206a/b), second magnet 207, first contact 209a, and second contact 209b.

In some embodiments, the first and second magnets 201 and 207, respectively, have in-plane magnetic anisotropy. In some embodiments, first magnet 201 comprises first and second portions, wherein the first portion of first magnet 201 is adjacent to the stack of layers (e.g., layers 202a, 203a, and 204a), and wherein the second portion of first magnet 201 is adjacent to a magnetoelectric material stack or layer 206b. In some embodiments, second magnet 207 comprises first and second portions, wherein the first portion of second magnet 207 is adjacent to the magnetoelectric material stack or layer 206a, and wherein the second portion of second magnet 207 is adjacent to stack of layers (e.g., layers 202b, 203b, and 204b).

In some embodiments, conductor 205 (or charge interconnect) is coupled to at least a portion of the stack of layers (e.g., one of layers 202a, 203a, or 204a) and ME layer 206a. For example, conductor 205 is coupled to layer 204a of the stack.

In some embodiments, the stack of layers (e.g., layers 202a/b, 203a/b, or 204a/b) is to provide an inverse Rashba-Edelstein effect (or inverse spin Hall effect). In some embodiments, the stack of layers provide spin-to-charge conversion where a spin current $I_s$ (or spin energy $J_s$) is injected from first magnet 201 and charge current $I_c$ is generated by the stack of layers. This charge current $I_c$ is provided to conductor 205 (e.g., charge interconnect). In contrast to spin current, charge current does not attenuate in conductor 205. The direction of the charge current $I_c$ depends on the direction of magnetization of first magnet 201.

In some embodiments, the charge current $I_c$ charges the capacitor around ME layer 206a and switches its polarization. ME layer 206a exerts exchange bias on second magnet layer 207, and the direction of the exchange bias determines the magnetization of second magnet 207. The same dynamics occurs by ME layer 206b which exerts exchange bias on first magnet 201 according to input charge current on conductor 211a.

In this example, the length of first magnet 201 is $L_m$, the width of conductor 205 is We, the length of conductor 205 from the interface of layer 204a to ME layer 206a is $L_c$, to is the thickness of the magnets 201 and 207, and $t_{ME}$ is the thickness of ME layer 206a. In some embodiments, conductor 205 comprises a material including one of: Graphene, Cu, Ag, Al, or Au.

In some embodiments, the input and output charge conductors (211a and 211b, respectively) and associated spin-to-charge and charge-to-spin converters are provided. In some embodiments, input charge current $I_{charge(IN)}$ (or $I_{IN}$) is provided on interconnect 211a (e.g., charge interconnect made of same material as interconnect 205). In some embodiments, interconnect 211a is coupled to first magnet 201 via ME layer 206b. In some embodiments, interconnect 211a is orthogonal to first magnet 201. For example, interconnect 211a extends in the +x direction while first magnet 201 extends in the -y direction. In some embodiments, $I_{charge}(I_N)$ is converted to corresponding magnetic polarization of 201 by ME layer 206b. The materials for ME layers 206a/b are the same as the materials of ME layer 206.

In some embodiments, an output interconnect 211b is provided to transfer output charge current $I_{charge(OUT)}$ to another logic or stage. In some embodiments, output interconnect 211b is coupled to second magnet 207 via a stack of layers that exhibit spin Hall effect and/or Rashba-Edelstein effect. For example, layers 202b, 203b, and 204b are provided as a stack to couple output interconnect 211b with second magnet 207. Material wise, layers 202b, 203b, and 204b are formed of the same material as layers 202a, 203a, and 204a, respectively.

In some embodiments, ME layer 206a/b forms the magnetoelectric capacitor to switch the magnets 201/207. For example, conductor 205 forms one plate of the capacitor, magnet 207 forms the other plate of the capacitor, and layer 206a is the magnetic-electric oxide that provides out-of-plane exchange bias to second magnet 207. In some embodiments, the magnetoelectric oxide comprises perpendicular exchange bias due to partially compensated anti-ferromagnetism.

In some embodiments, first magnet 201 injects a spin polarized current into the high spin-orbit coupling (SOC) material stack (e.g., layers 202a, 203a, and 204a). The spin polarization is determined by the magnetization of first magnet 201.

In some embodiments, the stack comprises i) an interface 203a/b with a high density 2D (two dimensional) electron gas and with high SOC formed between 202a/b and 204a/b materials such as Ag or Bi, or ii) a bulk material 204 with high Spin Hall Effect (SHE) coefficient such as Ta, W, or Pt. In some embodiments, a spacer (or template layer) is formed between first magnet 201 and the injection stack. In some embodiments, this spacer is a templating metal layer which provides a template for forming first magnet 201. In some embodiments, the metal of the spacer which is directly coupled to first magnet 201 is a noble metal (e.g., Ag, Cu, or Au) doped with other elements from Group 4d and/or 5d of the Periodic Table. In some embodiments, first magnet 201 (and by extension first semi-insulating magnet 209a) are sufficiently lattice matched to Ag (e.g., a material which is engineered to have a lattice constant close (e.g., within 3%) to that of Ag).

Here, sufficiently matched atomistic crystalline layers refer to matching of the lattice constant 'a' within a threshold level above which atoms exhibit dislocation which is harmful to the device (for instance, the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (i.e., matching gets closer to perfect matching), spin injection efficiency from spin transfer from first magnet 201 to first ISHE/ISOC stacked layer increases. Poor matching (e.g., matching worse than 5%) implies dislocation of atoms that is harmful for the device.

Table 1 summarizes transduction mechanisms for converting magnetization to charge current and charge current to magnetization for bulk materials and interfaces.

TABLE 1

| Transduction mechanisms for Spin to Charge and Charge to Spin Conversion | | |
|---|---|---|
| | Spin → Charge | Charge → Spin |
| Bulk | Inverse Spin Hall Effect | Magnetoelectric effect |
| Interface | Inverse Rashba-Edelstein Effect | Magnetoelectric effect |

In some embodiments, a transistor (e.g., n-type transistor MN1) is coupled to first contact 209a. In this example, the drain terminal of transistor MN1 is coupled to a supply $V_{dd}$, the gate terminal of transistor MN1 is coupled to a control voltage $V_{clk1}$ (e.g., a switching clock signal, which switches between $V_{dd}$ and ground), and the source terminal of transistor MN1 is coupled to first contact 209a. In some embodiments, first contact 209a is made of any suitable conducting material used to connect the transistor to the first magnet 201. In some embodiments, the current $I_{drive}$ (or $I_{SUPPLY}$) from transistor MN1 generates spin current into the stack of layers (e.g., layers 202a, 203a, and 204a).

In some embodiments, along with the n-type transistor MN1 connected to $V_{dd}$, an n-type transistor MN2 is provided which couples layer 203a of the stack of layers (202a, 203a, and 204a) to ground. In this example, the drain terminal of transistor MN2 is coupled to layer 204a, the gate terminal of transistor MN2 is coupled to a control voltage $V_{clk1}$ (e.g., a switching clock signal, which switches between $V_{dd}$ and ground), and the source terminal of transistor MN2 is coupled to ground.

In some embodiments, n-type transistor MN3 is provided which is operable to couple power supply $V_{dd}$ to second contact 209b. In this example, the drain terminal of transistor MN3 is coupled to a supply $V_{dd}$, the gate terminal of transistor MN3 is coupled to a control voltage $V_{clk2}$ (e.g., a switching clock signal, which switches between $V_{dd}$ and ground and is of different phase than $V_{clk1}$), and the source terminal of transistor MN3 is coupled to second contact 209b. In some embodiments, second contact 209b is made of any suitable conducting material used to connect the transistor to the second magnet 207. In some embodiments, the current $I_{drive}$ from transistor MN3 generates spin current into the stack of layers (e.g., layers 202b, 203b, and 204b).

In some embodiments, along with the n-type transistor MN4 connected to $V_{dd}$, an n-type transistor MN4 is provided which couples layer 204b of the stack of layers (202b, 203b, and 204b) to ground. In this example, the drain terminal of transistor MN4 is coupled to layer 203b, the gate terminal of transistor MN4 is coupled to a control voltage $V_{clk2}$, and the source terminal of transistor MN4 is coupled to ground.

For purposes of explaining MESO logic device 200, MESO logic device can be considered to have two portions or sections. The first portion/section (or MESO input cell) comprises components/layers from 211a to the left of conductor 205, and the second portion/section (or MESO output cell) comprises conductor 205 to layer 211b to the right. An ideal unidirectional signal propagation scenario is as follows: an input charge current drives magnet 201 while a supply charge current is injected to the spin-orbit coupling (SOC) stack (202a, 203a, 204a). The magnet 201 switches and its directionality determines the output charge current ($I_{OUT1}$) direction in conductor 205. The output current $I_{OUT1}$ of the first MESO section drives the second MESO section, which continues to switch the MESO of that section. In the absence of transistors MN2 and MN4, simply connecting the two MESO sections in series can cause the ferroelectric capacitor in the second section of the MESO to switch input magnet 201 of the first section, which disturbs the logic operation.

In some embodiments, transistors MN1 and MN2 of the first section are in series with the nanomagnet 201 and SOC stack (202a, 203a, and 204a). In some embodiments, transistors MN3 and MN4 of the second section are in series with the nanomagnet 207 and SOC stack (202b, 203b, and 204b). In some embodiments, different clock signals ($V_{clk1}$ and $V_{clk2}$) are applied to the gate terminals of the transistors, where transistors connected to the same MESO section share the same clock. The polarization direction of the ferroelectric charge in the magnet stack determines the magnetic directions of the nano-magnets 201 and 207, which determines the output current direction.

In this example, in the first MESO section, $I_{IN}$ (or $I_{charge(IN)}$) from input conductor 211a induces positive polarization charge on the bottom plate of the ferroelectric capacitor 206b and results in polarization of magnet 201. With a charge current $I_{SUPPLY}$ (or $I_{drive}$) from layer 209a to 204a, output current $I_{OUT1}$ is generated on conductor 205 which is inversed from the input. Current $I_{OUT1}$ then provides input current to the next MESO section. This current induces a negative polarization charge on the bottom plate of the ferroelectric capacitor 206a of the next MESO section. This polarization charge causes magnet 207 of the second MESO section to switch which results in the output current $I_{OUT2}$ to be in the same direction as IN (with the same $I_{SUPPLY}$ current direction).

The following section describes the spin to charge and charge to spin dynamics. In some embodiments, the spin-orbit mechanism responsible for spin-to-charge conversion is described by the inverse Rashba-Edelstein effect in 2D electron gases. The Hamiltonian (energy) of spin-orbit coupling electrons in a 2D electron gas is:

$$H_R = \alpha_R(k \times \hat{z}) \cdot \vec{\sigma}$$

where $\alpha_R$ is the Rashba-Edelstein coefficient, 'k' is the operator of momentum of electrons, $\hat{z}$ is a unit vector perpendicular to the 2D electron gas, and $\vec{\sigma}$ is the operator of spin of electrons.

The spin polarized electrons with direction of polarization in-plane (e.g., in the xy-plane) experience an effective magnetic field dependent on the spin direction:

$$\vec{B}(k) = \frac{\alpha_R}{\mu_B}(\hat{k} \times \hat{z})$$

where $\mu_B$ is the Bohr magneton

This results in the generation of a charge current $I_c$ in interconnect 205 proportional to the spin current $I_s$ (or $J_s$). The spin-orbit interaction by Ag and Bi interface layers 202 and 204 (e.g., the Inverse Rashba-Edelstein Effect (IREE)) produces a charge current $I_c$ in the horizontal direction given as:

$$I_c = \frac{\lambda_{IREE} I_s}{w_m}$$

where $w_m$ is width of the input magnet 201, and $\lambda_{IREE}$ is the IREE constant (with units of length) proportional to $\alpha_R$.

Alternatively, the Inverse Spin Hall Effect in Ta, W, or Pt layer 203a/b produces the horizontal charge current $I_c$ given as:

$$I_c = \frac{\Theta_{SHE} t_{SHE} I_s}{2 w_m}$$

Both IREE and ISHE effects produce spin-to-charge current conversion around 0.1 with existing materials at 10 nm (nanometers) magnet width. For scaled nanomagnets (e.g., 5 nm wide magnets) and exploratory SHE materials such as $Bi_2Se_3$, the spin-to-charge conversion efficiency can be between 1 and 2.5. The net conversion of the drive charge current $I_{drive}$ to magnetization dependent charge current is given as:

$$I_c = \pm \frac{\lambda_{IREE} P I_s}{w_m} \text{ for IREE and } I_c = \pm \frac{\Theta_{SHE} t_{SHE} P I_s}{2 w_m} \text{ for ISHE}$$

where 'P' is the dimensionless spin polarization. For this estimate, the drive current $I_{drive}$ and the charge current $I_c = I_d = 100$ µA is set. As such, when estimating the resistance of the ISHE interface to be equal to R=100Ω, then the induced voltage is equal to $V_{ISHE} = 10$ mV.

The charge current $I_c$, carried by interconnect 205, produces a voltage on the capacitor of ME layer 206a comprising magnetoelectric material dielectric (such as $BiFeO_3$ (BFO) or $Cr_2O_3$) in contact with second magnet 207 (which serves as one of the plates of the capacitor) and interconnect 205 (which serves as the other of the plates of the capacitor). In some embodiments, magnetoelectric materials are either intrinsic multiferroic or composite multiferroic structures. As the charge accumulates on the magnetoelectric capacitor of ME layer 206a, a strong magnetoelectric interaction causes the switching of magnetization in second magnet 207 (and by extension second semi-insulating magnet 209b).

For the following parameters of the magnetoelectric capacitor: thickness $t_{ME} = 5$ nm, dielectric constant $\varepsilon = 500$, area A=60 nm×20 nm. Then the capacitance is given as:

$$C = \frac{\varepsilon \varepsilon_0 A}{t_{ME}} \approx 1 fF$$

Demonstrated values of the magnetoelectric coefficient is $\alpha_{ME} \sim 10/c$, where the speed of light is c. This translates to the effective magnetic field exerted on second semi-insulating magnet 207, which is expressed as:

$$B_{ME} = \alpha_{ME} E = \frac{\alpha_{ME} V_{ISHE}}{t_{ME}} \sim 0.06 T$$

This is a strong field sufficient to switch magnetization.

The charge on the capacitor of ME layer 206a is $$Q = \frac{1}{fF} \times 10 \text{ mV} = 10 \text{ } aC,$$

and the time to fully charge it to the induced voltage is $$td = 10 \frac{Q}{I_d} \sim 1 \text{ ps}$$

(with the account of decreased voltage difference as the capacitor charges). If the driving voltage is $V_d$=100 mV, then the energy $E_{sw}$ to switch is expressed as:

$E_{sw} \sim 100 \text{ mV} \times 100 \text{ } \mu A \times 1ps \sim 10aJ$ which is comparable to the switching energy of CMOS transistors. Note that the time to switch $t_{sw}$ magnetization remains much longer than the charging time and is determined by the magnetization precession rate. The micromagnetic simulations predict this time to be $t_{sw} \sim 100$ ps, for example.

In some embodiments, materials for first and second magnets 201 and 207 have saturated magnetization $M_s$ and effective anisotropy field $H_k$. Saturated magnetization $M_s$ is generally the state reached when an increase in applied external magnetic field H cannot increase the magnetization of the material. Anisotropy Hk generally refers material properties that are highly directionally dependent.

In some embodiments, materials for first and second magnets 201 and 207, respectively, are non-ferromagnetic elements with strong paramagnetism which have a high number of unpaired spins but are not room temperature ferromagnets. A paramagnet, as opposed to a ferromagnet, exhibits magnetization when a magnetic field is applied to it. Paramagnets generally have magnetic permeability greater or equal to one and hence are attracted to magnetic fields. In some embodiments, magnets 209a/b comprise a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$(Neodymium oxide), $KO_2$ (potassium superoxide), praseodymium (Pr), Samarium (Sm), $Sm_2O_3$ (samarium oxide), Terbium (Tb), $Tb_2O_3$(Terbium oxide), Thulium (Tm), $Tm_2O_3$ (Thulium oxide), or $V_2O_3$ (Vanadium oxide). In some embodiments, the first and second paramagnets 201 and 207 comprise dopants selected from a group which includes one or more of: Ce, Cr, Mn, Nb, Mo, Tc, Re, Nd, Gd, Tb, Dy, Ho, Er, Tm, or Yb.

In some embodiments, first and second magnets 201 and 207, respectively, are ferromagnets. In some embodiments, first and second magnets 201 and 207, respectively, comprise one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge.

In some embodiments, the stack of layers providing spin orbit coupling comprises: a first layer 202a/b comprising Ag, wherein the first layer is adjacent to first magnet 209a/b; and a second layer 204a/b comprising Bi or W, wherein second layer 204a/b is adjacent to first layer 202a/b and to a conductor (e.g., 205, 211b). In some embodiments, a third layer 203a/b (having material which is one or more of Ta, W, or Pt) is sandwiched between first layer 202a/b and second layer 204a/b as shown. In some embodiments, the stack of layers comprises a material which includes one of: β-Ta, β-W, W, Pt, Cu doped with Iridium, Cu doped with Bismuth, or Cu doped an element of 3d, 4d, 5d, 4f, or 5f of periodic table groups.

ME materials may be divided into three categories. The first category of materials provide polarization and anti-ferromagnetization. These materials include Bismuth ferrite (BFO), Lithium Iron Oxide (LFO) super lattice. The second category of materials also provide polarization and anti-ferromagnetization, but at low temperatures. These materials include $TbMnO_3$ and similar multiferroic materials. The third category of materials are magnetoelectric para-electrics. These magnetoelectric para-electrics materials lack polarization, but provide anti-ferromagnetization. The magnetoelectric para-electrics materials include chromia ($Cr_2O_3$).

In some embodiments, ME layer 206a/b comprises one of: dielectric, para-electric, or ferro-electric material. In some embodiments, ME layer 206a/b is formed of a material which includes one of: $Cr_2O_3$ and multiferroic material. In some embodiments, ME layer 206 comprises Cr and O. In some embodiments, the multiferroic material comprises BFO (e.g., $BiFeO_3$), LFO ($LuFeO_2$, $LuFe_2O_4$), or La doped $BiFeO_3$. In some embodiments, the multiferroic material includes one of: Bi, Fe, O, Lu, or La.

In some embodiments, first contact 209a is replaced with a first semi-insulating magnet 209a, and second contact 209b is replaced with a second semi-insulating magnet 209b. In some embodiments, first semi-insulating magnet 209a is adjacent to first magnet 201 and is also coupled to a transistor (e.g., n-type transistor MN1). As such, first semi-insulating magnet 209a functions as a displacement capacitor between the transistor MN1 and the first magnet 201. Here the term "semi-insulating magnet" generally refers to a material that has magnetic properties but has higher resistivity compared to normal ferromagnets. For example, semi-insulating or insulating magnets may not be conductive for charge current, but exhibit magnetic properties. The semi-insulating magnet or insulating magnet may have a Spinel crystal structure, can be hexagonal (e.g., $Fe_2O_3$), or they can belong to any of the crystal classes. In some embodiments, materials for semi-insulating or insulating magnets include one of: $Fe_2O_3$, $Co_2O_3$, $Co_2FeO_4$, or $Ni_2FeO_4$. In some embodiments, elements for semi-insulating or insulating magnets include one or more of: Fe, O, Co or Ni. The direction of the charge current $I_c$ also depends on the direction of magnetization of first semi-insulating magnet 209a.

In some embodiments, first semi-insulating magnet 209a and second semi-insulating magnet 209b form displacement capacitors. The nature of the displacement capacitor may be set by the leakage and the dielectric constants of the semi-insulating magnets 209a/b. In some embodiments, first semi-insulating magnet 209a and second semi-insulating magnet 209b form dielectric capacitors, where a bound charge is generated at the plates.

In some embodiments, first and second semi-insulating magnets 209a and 209b, respectively, comprise a material which includes one or more of: Co, Fe, No, or O. In some embodiments, the first and second semi-insulating magnets 209a and 209b, respectively, comprise a material which includes one or more of: $Co_2O_3$, $Fe_2O_3$, $Co_2FeO_4$, or $Ni_2FeO_4$. In some embodiments, first and second semi-insulating magnets 209a and 209b have Spinel crystal structure. In some embodiments, magnets 209a and 209b have non-insulating properties. For example, magnets 209a and 209b can be paramagnets or ferromagnets.

In some embodiments, the magnetization of first semi-insulating magnet 209a is determined by the magnetization of first magnet 201. For example, when first magnet 201 has magnetizations pointing in –y direction, then first semi-insulating magnet 209a has magnetization pointing in the –y direction. In some embodiments, the magnetization of second semi-insulating magnet 209b is determined by the magnetization of second magnet 207. For example, when second magnet 207 has magnetizations pointing in –y direction, then second semi-insulating magnet 209b has magnetization pointing in the –y direction. In some embodiments, second semi-insulating magnet 209b is adjacent to second magnet 207 such that second magnet 207 is between second semi-insulating magnet 209b and the stack of layers providing spin orbit coupling.

While various embodiments are illustrated with n-type transistors MN1, MN2, MN3, and MN4, p-type transistors can be used instead and the switching gate signals can be logically inversed. In some embodiments, a combination of n-type and p-type transistors are used. For example, the transistors coupled to power supply Vdd are p-type transistors while the transistors coupled to ground are n-type transistors. Appropriate logic change can be made to the driving gate signals to achieve the same technical effect (e.g., unidirectionality) as achieved by the n-type transistors MN1, MN2, MN3, and MN4. In some embodiments, a combination of n-type and p-type devices (e.g., transmission gates) can be used instead of n-type transistors MN1, MN2, MN3, and MN4.

FIG. 3A illustrates an equivalent circuit model 300 for the first section (or MESO input cell) of the unidirectional MESO logic of FIG. 2A, in accordance with some embodiments. Here $R_{magnet}$, $R_{s1}$, $R_{s2}$, $R_{IREE}$ and $R_{IC}$ are the modeled resistances for magnet 201, SOC stack (202a, 203a, 204a) shunt resistance, the Inverse Rashba-Edelstein Effect (IREE) resistance, and interconnect resistance of conductor 205, respectively. In some embodiments, the IREE effect from the current in the SOC stack is modeled as a current controlled current source, of which the current direction is determined by the magnet "state" (e.g., the nano-magnet direction, which is inconsistent with the polarization charge in the ferroelectric). In some embodiments, the ferroelectric 206b is modeled as a non-linear capacitor using Landau Khalatnikov (LK) equations.

Figure 3B:
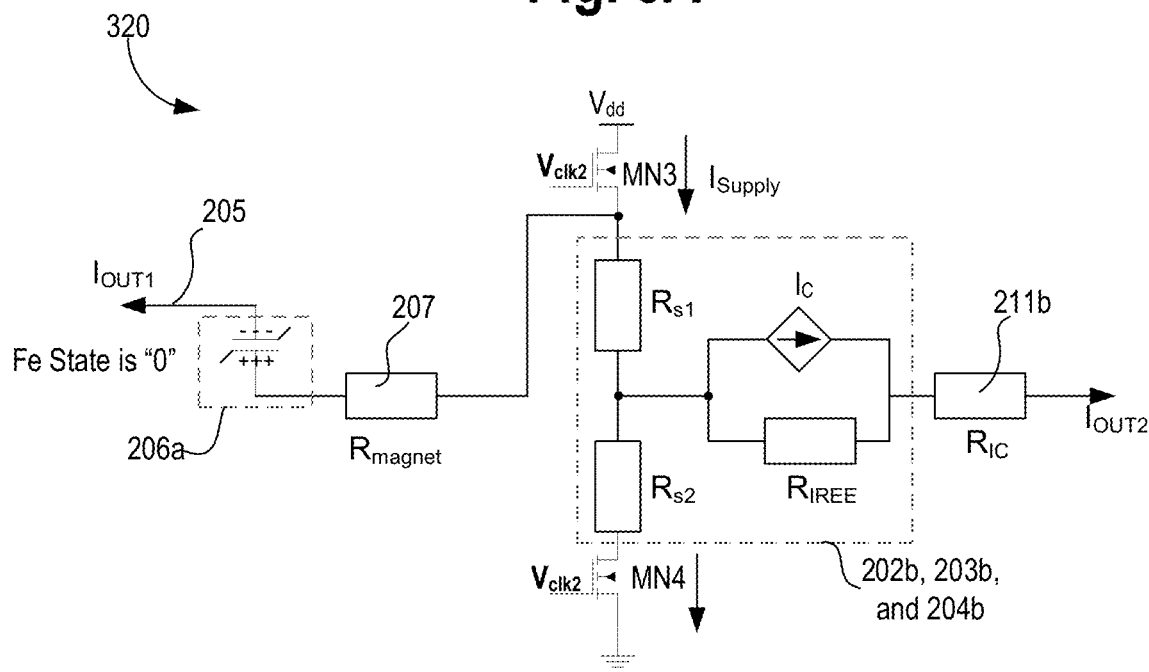
FIG. 3B illustrates an equivalent circuit model for a second section (e.g., output section) of the unidirectional MESO logic of FIG. 2A, in accordance with some embodiments.

FIG. 3B illustrates an equivalent circuit model 320 for the second section (e.g., MESO output cell) of the unidirectional MESO logic of FIG. 2A, in accordance with some embodiments. Here $R_{magnet}$, $R_{s1}$, $R_{s2}$, $R_{IREE}$ and $R_{IC}$ are the modeled resistances for magnet 207, SOC stack (202b, 203b, 204b) shunt resistance, the Inverse Rashba-Edelstein Effect (IREE) resistance, and interconnect resistance of conductor 211b, respectively. In some embodiments, the IREE effect from the current in the SOC stack is modeled as a current controlled current source, of which the current direction is determined by the magnet "state" (e.g., the nano-magnet direction, which is inconsistent with the polarization charge in the ferroelectric). In some embodiments, the ferroelectric 206a is modeled as a non-linear capacitor using LK equations. In some embodiments, to enable the unidirectional signal propagation, $V_{clk1}$ and $V_{clk2}$ are out-of-phase and with overlap. In some embodiments, $V_{clk1}$ and $V_{clk2}$ are out-of-phase and non-overlapping. For example, $V_{clk1}$ and $V_{clk2}$ are out-of-phase by $180°$.

FIGS. 4A-B illustrate a ferroelectric Landau Khalatnikov (LK) model 400 and corresponding plot 420, respectively, showing two ferroelectric states. In some embodiments, positive polarization charge +QF corresponds to state '1' of the magnet, while negative polarization charge –QF corresponds to state '0' of the magnet. Here, normalized +QF(1) and –QF(–1) are used in circuit simulation to indicate the ferroelectric states.

LK model 400 illustrates a circuit that provides ferroelectric voltage $V_{FE}$ and comprises capacitor C0 in parallel with a series coupled resistance ρ and internal capacitance $C_F(Q_{FE})$ that provides internal voltage $V_{int}$. Here, 'A' is the area of capacitor C0, 'd' is the distance between the plates of capacitor C0, and E0 is the dielectric constant. Plot 420 shows the capacitance behavior of a ferroelectric capacitor (FE-Cap) when connected with a load capacitor. Here, the x-axis is the internal voltage $V_{int}$ in volts, while the y-axis is the charge from the ferroelectric capacitor when connected with a load capacitor. The dotted region in plot 420 represents the negative capacitance region between the coercive voltage bounds.

When a voltage source drives the FE-Cap connected with a load capacitor, the operating region of a FE-cap is biased by the load capacitance. When the FE-Cap is biased at the negative capacitance region (e.g., charge on FE-cap is positive while the voltage across the FE-cap is negative, and vice versa), the voltage across the load capacitance can be higher than the input voltage, owning to the ferroelectric polarity charge induced voltage amplification effect. On the other hand, when the FE-Cap is biased at the positive capacitance region, it operates as a regular capacitor. The negative capacitance effect has been mainly utilized for transistor gate stack enhancement (e.g., negative capacitance FETs) for low-voltage transistors. Some embodiments use the concept of negative capacitance to a MESO logic to enhance the switching of magnets via the magnetoelectric layer.

Figure 5:
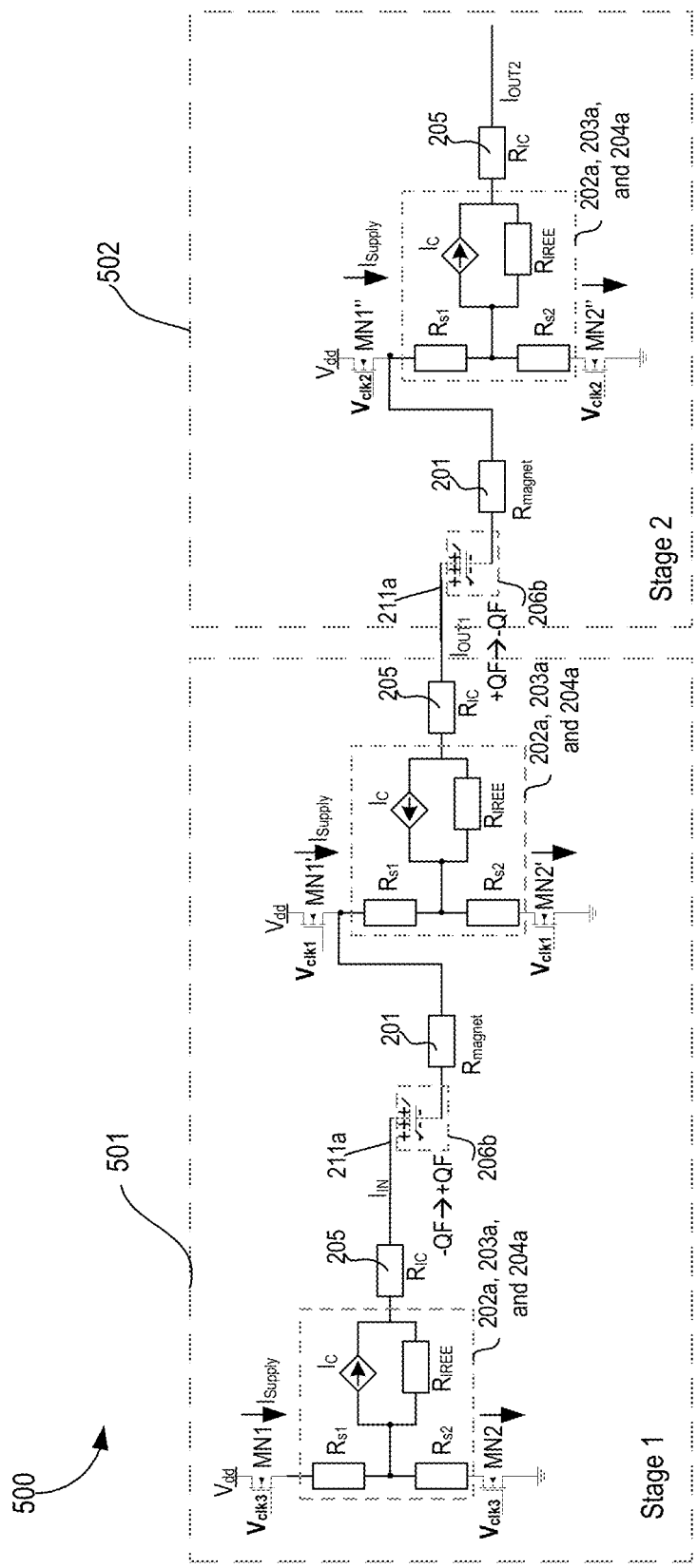
FIG. 5 illustrates a unidirectional cascaded MESO logic, according to some embodiments of the disclosure.

FIG. 5 illustrates a unidirectional cascaded MESO logic 500, according to some embodiments of the disclosure. In this example, MESO logic 500 comprises two MESO stages 501 and 502 that are cascaded with one another. To drive the MESO logic 500, three different clocks are used to drive the transistor pairs—MN1, MN2; MN1', MN2'; and MN1", MN2"—to ensure unidirectional flow of current and integrity of logic operation.

In some embodiments, $V_{clk3}$ is applied to control the input drivers (gates of transistors MN1 and MN2) of MESO stage 501. In some embodiments, the input driver provides a positive current IN to the first ferroelectric capacitor 206b. In this example, VDD of 100 mV and $V_{clk1}$, $V_{clk2}$, $V_{clk3}$ of 1 V with 12 ns (nanoseconds) clock period are used. In some embodiments, two out of the three clocks ($V_{clk1}$, $V_{clk2}$, $V_{clk3}$) have an overlap of $\frac{1}{3}^{rd}$ clock high duration (e.g., t=2 ns). However, the overlap can by $\frac{1}{4}^{th}$ of clock high duration or other fractions that allow unidirectional flow of current and integrity of logic operation. In the initial condition, ferroelectric capacitor 206b of MESO stage 501 has negative charge −QF (MESO1.QFE=−1) and ferroelectric capacitor 206b of MESO stage 502 has positive charge+QF (MESO2.QFE=+1), which indicate their magnet states of '0' and '1', respectively.

Figure 6:
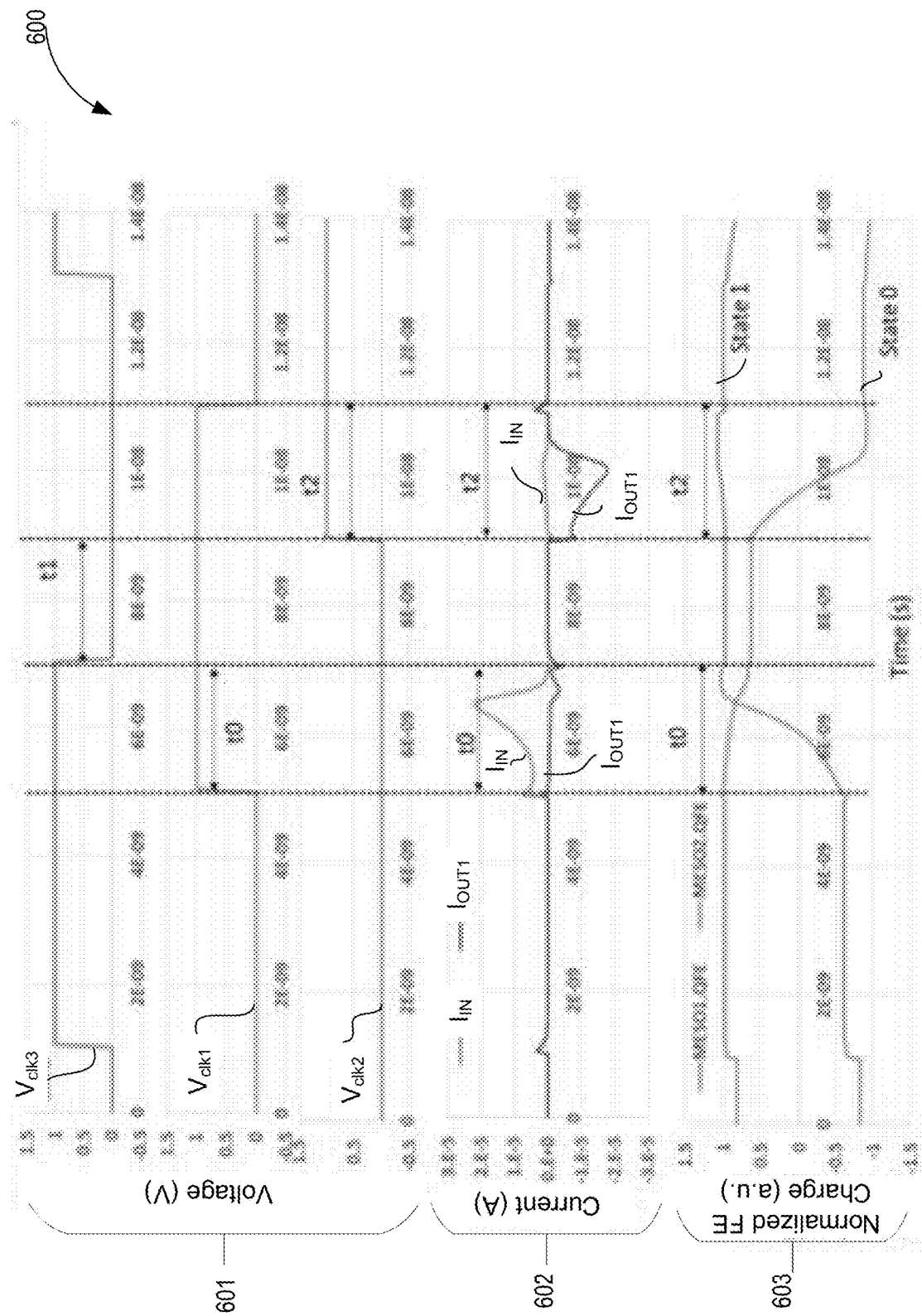
FIG. 6 illustrates a plot showing transient simulation of the unidirectional cascaded MESO logic of FIG. 5, according to some embodiments of the disclosure.

FIG. 6 illustrates plot 600 (which includes sub-plots 601, 602, and 603) showing transient simulation of the unidirectional cascaded MESO logic of FIG. 5, according to some embodiments of the disclosure. Sub-plot 601 illustrates $V_{clk1}$, $V_{clk2}$, and $V_{clk3}$ which are control voltages to the drive transistors. Here, y-axis is voltage and x-axis is time. From time 0 ns to 1 ns, $V_{clk1}=V_{clk2}=V_{clk3}=0$. As such, all the drive transistors are off and no current flows, and the states of the magnets are unchanged. From time 1 ns to 5 ns, $V_{clk1}=V_{clk2}=0$, $V_{clk3}=1$. As such the first input driver has a DC current path to its ground via transistors MN1 and MN2, while other transistors MN1', MN2', MN1", and MN2" are off. Because $I_{SUPPLY}$ is Off for MESO devices, no transient current flows (e.g., $I_N=0$).

During time t0 (e.g., 5 ns to 7 ns), $V_{clk1}=V_{clk3}=1$, $V_{clk2}=0$, $I_{SUPPLY}$ of MESO stage 501 is on while $I_{SUPPLY}$ of MESO stage 502 is off. The ferroelectric 206b in MESO stage 501 (MESO1.Fe) has a transient current path from the input driver $V_{DD}$ to the ground of MESO stage 501, while the transient conduction path from MESO stage 501 to MESO stage 502 through $I_{OUT1}$ is off. In this example, ferroelectric 206b of MESO stage 501 switches from −QF to +QF due to positive current $I_N$, while the ferroelectric 206b of MESO stage 502 is unchanged.

During time t1 (e.g., 7 ns to 9 ns), $V_{clk3}=V_{clk2}=0$, $V_{clk1}=1$, ferroelectrics 206b of MESO stages 501 and 502 are isolated since no conducting path exists. During time t2, $V_{clk1}=V_{clk2}=1$, $V_{clk3}=0$, a transient current path exists from $V_{dd}$ of MESO stage 501 to ground of MESO stage 502. Since +QF is deposited on ferroelectric 206b of MESO stage 501 (MESO1.QFe) during time t0, a negative transient current $I_{OUT1}$ is generated due to IREE and discharges ferroelectric 206b of MESO stage 501 (MESO2.QFe). As such, magnet 201 of MESO stage 502 switches from state '1' to state '0' with negative polarization charge. Note that magnet 201 of MESO stage 501 switches when $V_{clk3}$ and $V_{clk1}$ overlap (e.g., at t0), and magnet 201 of MESO stage 502 switches when $V_{clk1}$ and $V_{clk2}$ overlap (e.g., t2). In some embodiments, each magnet 201 of a MESO stage switches once during one clock period. As such, choosing proper clock signals can enable cascaded MESO circuits in accordance with various embodiments. In some embodiments, as more MESO stages are cascaded, more clocks may be used to ensure unidirectional flow of current. In some embodiments, when propagated voltage through a MESO stage is less than a threshold of the ferroelectric capacitor, then no more clocks are used because unidirectionality is preserved.

Figure 7:
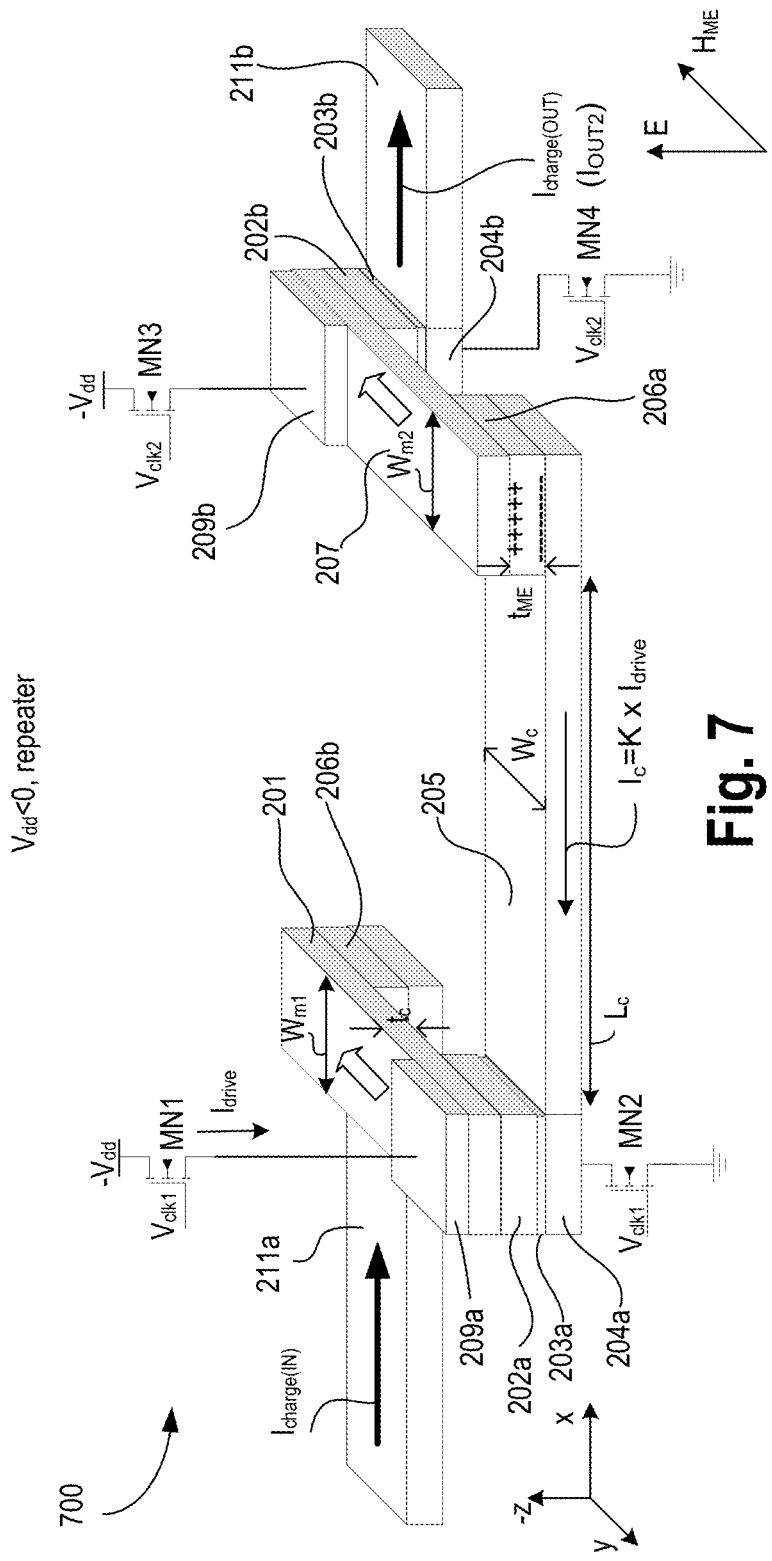
FIG. 7 illustrates a MESO logic operable as a repeater, according to some embodiments.

FIG. 7 illustrates a MESO logic 700 operable as a repeater, according to some embodiments. In some embodiments, to configure the MESO logic as a repeater, a portion of the stack of the layers (e.g., layer 204) is coupled to ground, contact 208b is coupled to a negative supply (e.g., −$V_{dd}$). In some embodiments, for repeater MESO logic 700, the magnetization direction of first semi-insulating magnet 201 is the same as the magnetization direction of second semi-insulating magnet 207. For example, the magnetization direction of first semi-insulating magnet 201 is in the +y direction while the magnetization direction of second semi-insulating magnet 207 is also in the +y direction.

Figure 8:
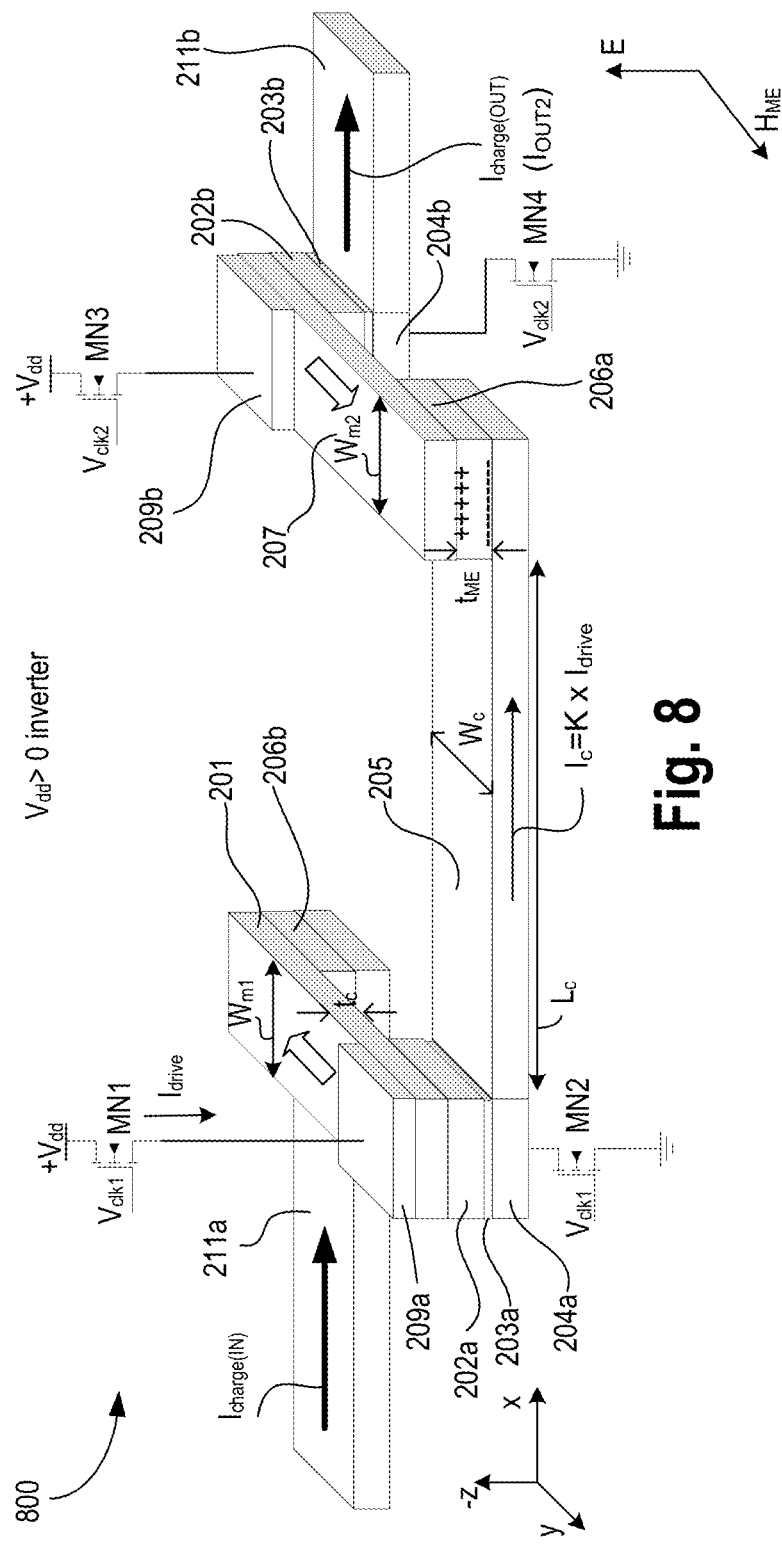
FIG. 8 illustrates a MESO logic operable as an inverter, according to some embodiments.

FIG. 8 illustrates a MESO logic 800 operable as an inverter, according to some embodiments. In some embodiments, to configure the MESO logic as an inverter, a portion of the stack of the layers (e.g., layer 204) is coupled to ground, contact 208b is coupled to a positive supply (e.g., +$V_{dd}$). In some embodiments, for inverter MESO logic 800, the magnetization direction of first semi-insulating magnet 201 is opposite compared to the magnetization direction of second semi-insulating magnets 207. For example, the magnetization direction of first semi-insulating magnet 201 is in the +y direction while the magnetization direction of second semi-insulating magnet 207 is in the −y direction.

Figure 9:
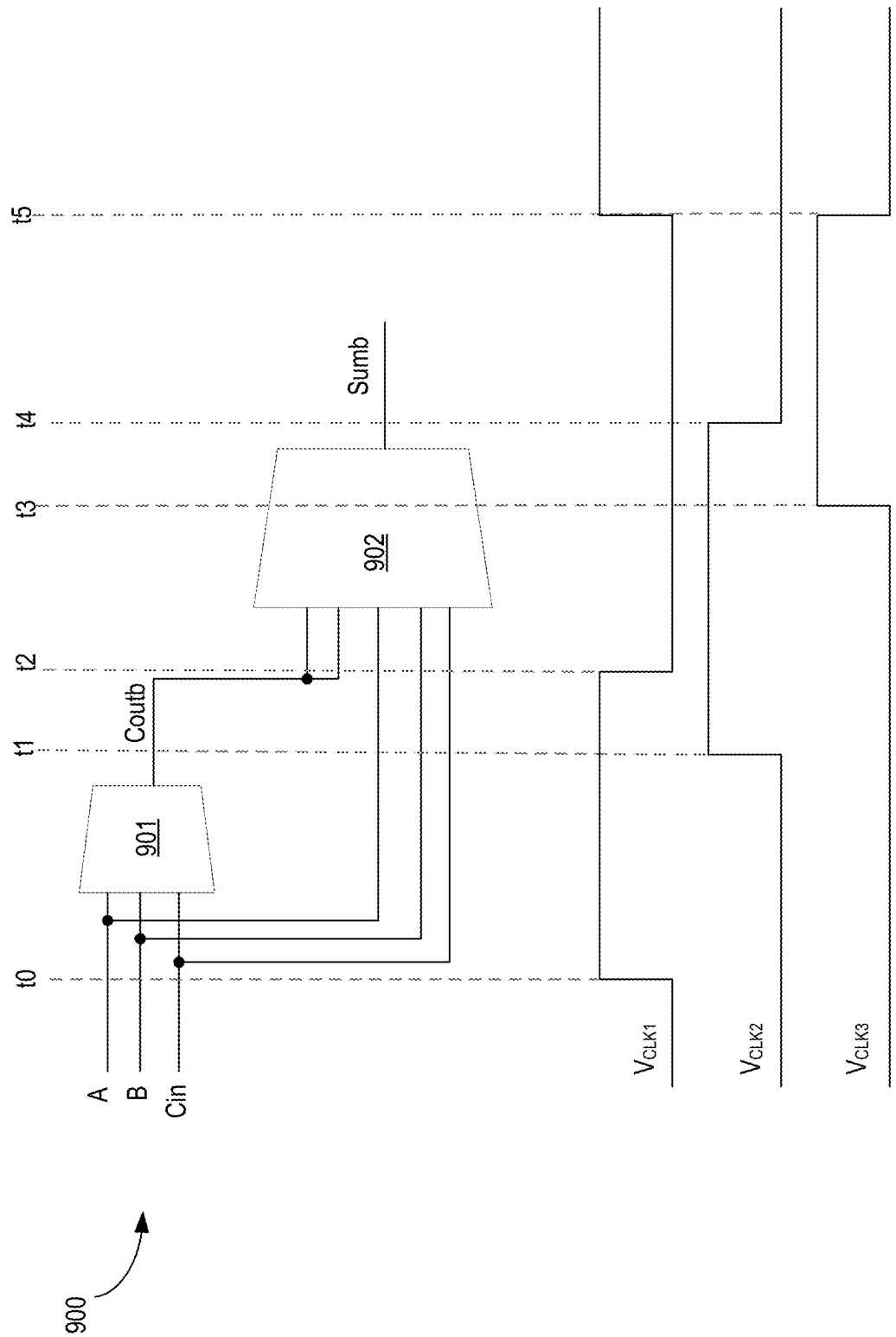
FIG. 9 illustrates a high-level architecture of a 1-bit MESO full adder, in accordance with some embodiments.

FIG. 9 illustrates a high-level architecture 900 of a 1-bit MESO full adder, in accordance with some embodiments. Architecture 900 comprises a 3-bit carry generation structure 901 and a multi-bit sum generation structure 902. The 3-bit carry generation structure 901 includes at least three cells (e.g., MESO input cells) comprising magnetoelectric material and spin orbit material. The 3-bit input carry generation structure 901 performs a minority logic operation on first (A), second (B), and third (Cin) inputs to generate a carry output (Coutb). In some embodiments, the multi-bit input sum generation structure 902 includes at least four cells (e.g., MESO input cells) comprising magnetoelectric material and spin orbit material. The carry output (Coutb) of the 3-bit input carry generation structure 901 is coupled to an input of the multi-bit sum generation structure 902. The multi-bit sum generation structure 902 performs a minority logic operation on the first (A), second (B), and third (Cin) inputs and two carry outputs (Coutb) to generate a sum output (Sumb).

The adder function by architecture 900 is performed using three clocks-$V_{CLK1}$, $V_{CLK2}$, and $V_{CLK3}$, where $V_{CLK1}$, $V_{CLK2}$, and $V_{CLK3}$ have different phases. Between time points t0 and t1 (e.g., $V_{CLK1}$ is high and $V_{CLK2}$ is low), the three input MESO cells of 3-bit carry generation structure 901 receives the three inputs (A, B, and Cin), and magnetizations of first magnets 201 of each MESO input cell is set according to the charge current direction of inputs A, B, and Cin, respectively. Between times points t1 and t2 (e.g., overlap time of high voltage phases of $V_{CLK1}$ and $V_{CLK2}$), the output MESO cells of 3-bit carry generation structure 901 performs minority logic operation of inputs A, B, and Cin, and generates the carry output (Coutb) accordingly.

The final sum (e.g., Sumb) is generated by the multi-bit input sum generating structure 902. In some embodiments, the multi-bit input sum generating structure 902 uses two Coutb inputs from two different output MESO cells using 3-bit carry generation structure 901 and performs a minority logic gate operation with inputs A, B, and Cin. As such, multi-bit input sum generating structure 902 includes input MESO cells to process A, B, and Cin. These input MESO cells of multi-bit sum generating structure 902 operate using $V_{CLK2}$. For example, during the high phase of $V_{CLK2}$, magnetizations of the magnet 201 of the input MESO cells of multi-bit sum generating structure 902 are set according to the charge directions of inputs A, B, and Cin. Note, Coutb is generated during overlap times of $V_{CLK1}$ and $V_{CLK2}$, and that inputs A, B, and Cin are interchangeable in minority gates (e.g., {A=1, B=1, Cin=0}, {A=1, B=0, Cin=1}, and {A=0, B=1, Cin=1} result in the same carry Coutb and sum Sumb). In some embodiments, A, B and Cin shown here are the outputs from previous stage or driver circuits, which are not part of the minority gate. The output Sumb is generated by the third clock $V_{CLK3}$. For example, between time points t3 and t4 (e.g., overlap time of high voltage phases of $V_{CLK2}$ and $V_{CLK3}$), an output MESO logic cell performs minority logic operation on A, B, Cin, and two Coutb to generate Sumb.

Figure 10:
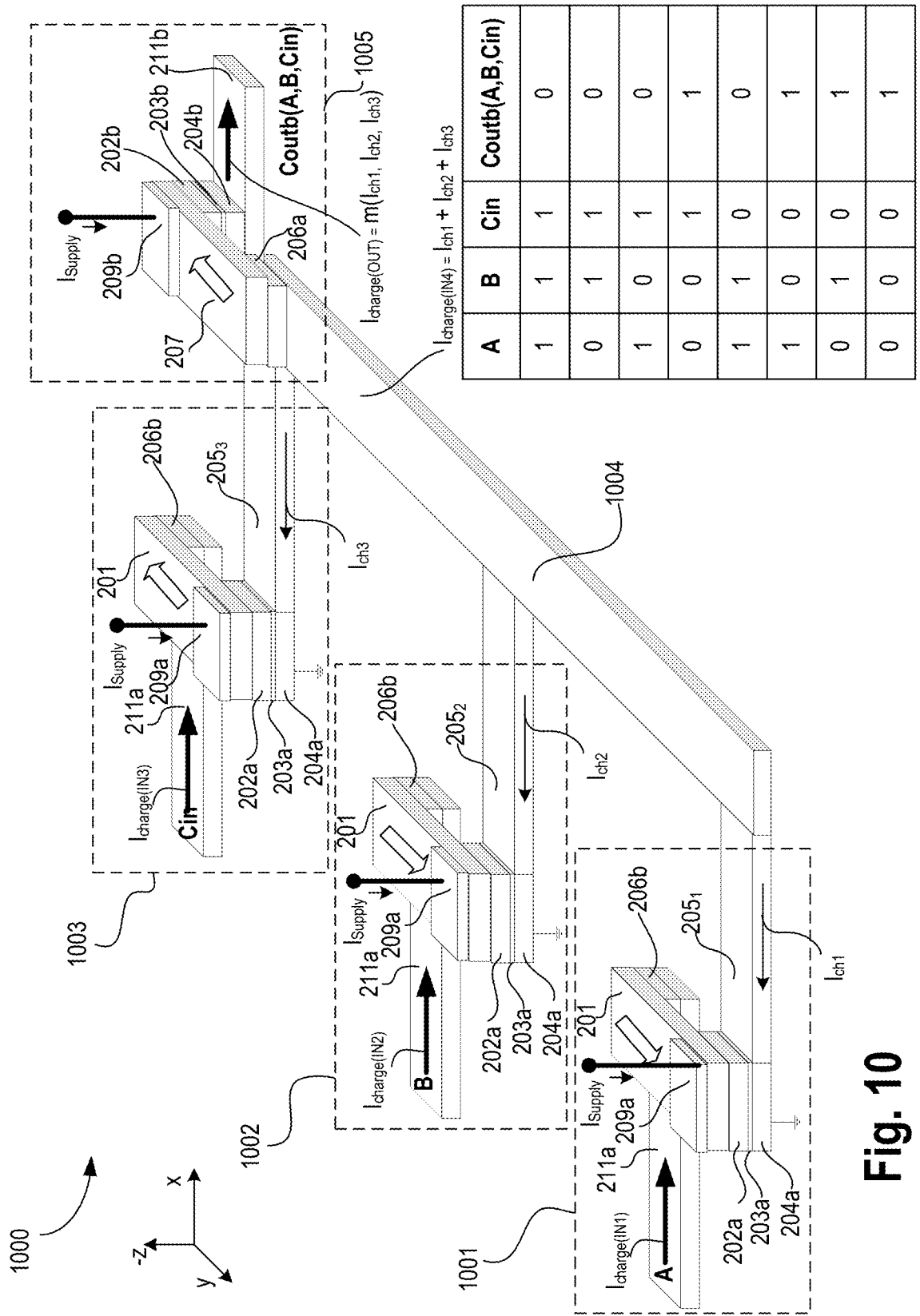
FIG. 10 illustrates a 3-input MESO minority gate device for carry generation, in accordance with some embodiments.

FIG. 10 illustrates a 3-input MESO minority gate device 1000 (e.g., 3-input MESO carry generation structure) for carry generation, in accordance with some embodiments. Device 1000 comprises three MESO input cells 1001, 1002, and 1003; common interconnect 1004; and a MESO output cell 1005. Conductors $205_{1-3}$ of each MESO input cell is coupled to the common interconnect 1004. As discussed herein, the output current direction of MESO device depends on the MESO logic state (e.g. ferromagnet state "1" and "0", or ferroelectric charge polarization state "+Q" and "–Q" in the ME structures). Because the output $I_{ch1}$, $I_{ch1}$, $I_{ch1}$ and $I_{charge(OUT)}$ of MESO device is charge current, connecting three MESO devices' output at the interconnect layer 1004 to the input of the fourth MESO device 1005 leads to the current summation operation at the input ME capacitor 206a of the fourth MESO device 1005.

In FIG. 10, the MESO based 3-input minority gate has a supply current ($I_{supply}$) in the z-direction. Here Coutb(A,B, Cin) denotes the output Coutb of a minority function for inputs A, B and Cin. The inputs A, B, and Cin may correspond to input charge current $I_{charge\ (IN1)}$, $I_{charge\ (IN2)}$, and $I_{charge\ (IN3)}$, respectively, or to the magnetization direction of magnets 201 of each MESO input cell 1001, 1002, and 1003, respectively. The inputs A, B, and Cin may also refer to magnetization states of magnets 201 of the respective input MESO cells. For example, magnetization of magnet 201 in the +y direction is State "0" while magnetization of magnet 201 in the –y direction is State "1".

The operation principle of the MESO minority gate 1000 is as follows. When states A and B of input MESO cell 1001 and 1002 are in State "0" (–Q) and state Cin of input MESO cell 1003 is in State "1" (+Q), the summation of the output current of MESO devices 1001, 1002, and 1003 generates a current in the same direction as input currents A or B, assuming near symmetric output current magnitude for State "1" and State "0". The summation of the output current from conductors $205_{1-3}$ then deposits positive charge in MESO device 1005 at its input node 1004, switching magnet 207 of MESO 1005 to State "1". The resulting MESO 1005's state is the same state Cin of MESO 1003, which is the "minority" state among A, B and Cin. The truth table of the 3-input MESO minority gate is shown in FIG. 10 which elaborates the minority gate function that generates Coutb.

FIGS. 11A-B illustrate plots 1100, 1101, 1102, 1120, 1121, and 1122 showing simulations of MESO minority gate device of FIG. 10 having ideal current sources, in accordance with some embodiments. Here, an ideal current source is used to ensure near symmetrical current drive strength for State "1" and State "0". The plots show the $V_{CLK1}$ and $V_{CLK2}$ control signals, MESO A (1001a), B (1001b) and C (1001c) output current, MESO O (1005) input current as well as the state change of MESO device O for two different cases, namely, (1) O=m(1,1,0) (A=B="1" or +Q, C="0" or –Q), and (2) O=m(0, 0, 1) (A=B="0" or –Q, C="1" or +Q), respectively. When $V_{CLK1}$ and $V_{CLK2}$ overlap, MESO A, B and Cin drives MESO O and generates an input current to MESO O based on the summation of their output current. The minority function is completed by MESO O, where its state follows the minority among A, B and Cin. Note, MESO O is the output MESO cell 1005 that provides Coutb. Depending on the connection of supply voltage polarizations to transistors coupled to layer 209a and 209b, the output Coutb can be inverted to be Cout as in FIGS. 7-8.

Figure 12:
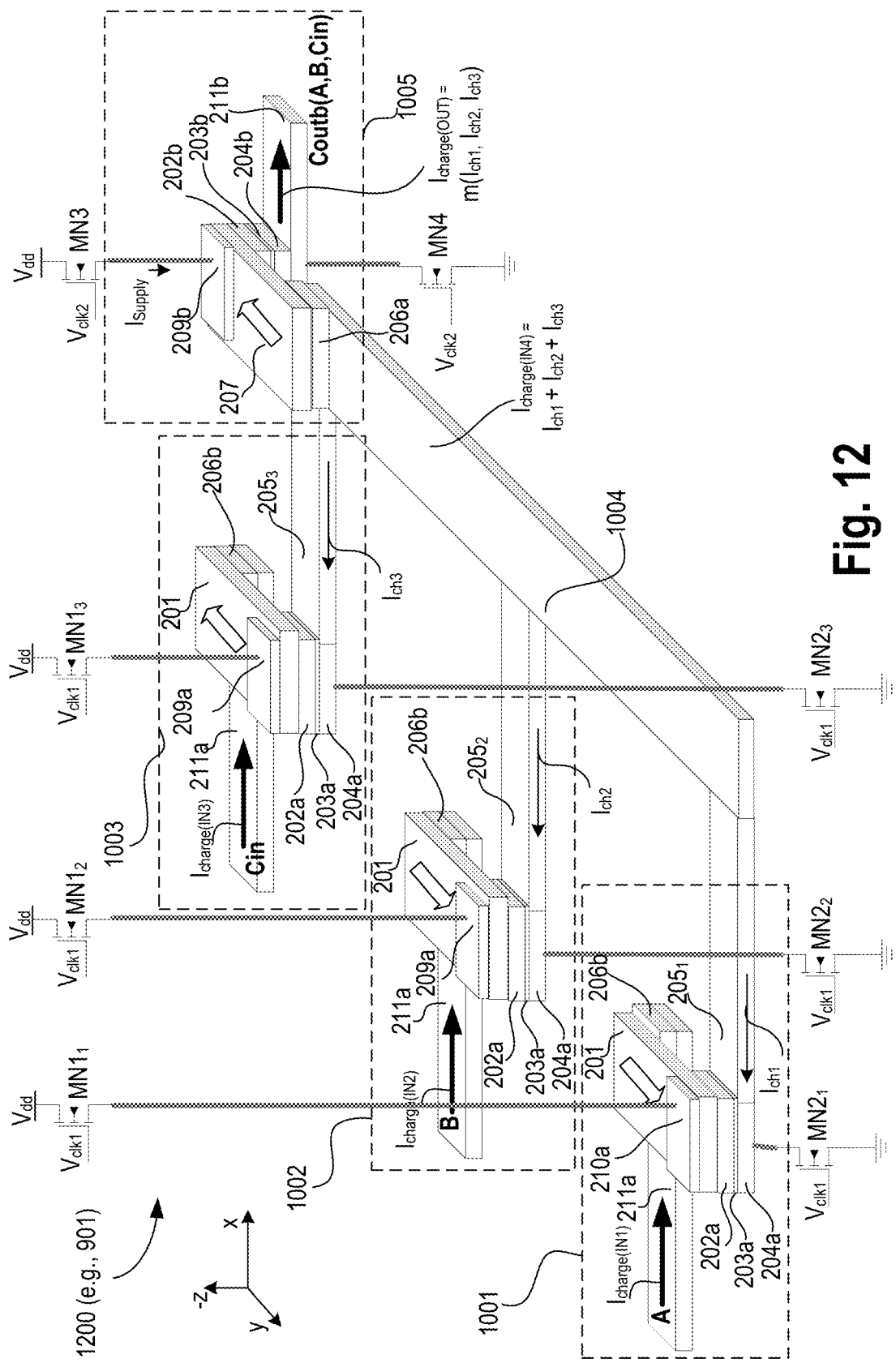
FIG. 12 illustrates a 3-input MESO minority gate device for carry generation with two-phase clocking, in accordance with some embodiments.

FIG. 12 illustrates a 3-input MESO minority gate device 1200 (e.g., 901) for carry generation with two-phase clocking, in accordance with some embodiments. To enable proper minority logic gate function and avoid backward propagation of charge from output MESO cell 1005 to the input MESO cells 1001, 1002, and 1003, a two-phase clocking scheme is employed as described with reference to FIGS. 2-6. In some embodiments, n-type transistors MN1 and MN2, controllable by clock 1 ($V_{CLK1}$) are used to control the propagation of input charge current to output conductor 205, while n-type transistors MN3 and MN4, controllable by clock 2 ($V_{CLK2}$) are used to control the propagation of the summed charge current at input conductor 1004 to minority gate MESO cell 1005 and control output charge current generation representing Contb to output conductor 211b.

For example, for MESO input cell 1001, the input magnet 201 is coupled to supply $V_{dd}$ via contact 209a and n-type transistor $MN1_1$ controllable by $V_{CLK1}$ while one of the SOC stack layers 204a is coupled to ground via n-type transistor $MN2_1$ controllable by $V_{CLK1}$. For MESO input cell 1002, the input magnet 201 is coupled to supply $V_{dd}$ via contact 209a and n-type transistor $MN1_{21}$ controllable by $V_{CLK1}$ while one of the SOC stack layers 204a is coupled to ground via n-type transistor $MN2_2$ controllable by $V_{CLK1}$. For MESO input cell 903, the input magnet 201 is coupled to supply Vdd via contact 209a and n-type transistor $MN1_3$ controllable by $V_{CLK1}$ while one of the SOC stack layers 204a is coupled to ground via n-type transistor $MN2_3$ controllable by $V_{CLK1}$. For MESO output cell 1005, the output magnet 207 is coupled to supply $V_{dd}$ via contact 209b and n-type transistor MN3 controllable by $V_{CLK2}$ while one of the SOC stack layers 204b is coupled to ground via n-type transistor MN4 controllable by $V_{CLK2}$. The two clocks $V_{CLK1}$ and $V_{CLK2}$ may have different phases, non-overlapping phases, or slightly overlapping phases. Any overlap in the phases of two clocks $V_{CLK1}$ and $V_{CLK2}$ is small enough to cause proper propagation of charge current without backward propagation of charge current.

During time t0, $V_{clk1}=1$ and $V_{clk2}=0$, $I_{SUPPLY}$ of MESO inputs cells 1001, 1002, and 1003 is on while $I_{SUPPLY}$ of MESO output cell stage 1305 is off. The ferroelectric 206b in MESO input cells 1001, 1002, and 1003 has a transient current path from the input driver $V_{DD}$ to the ground, while the transient conduction path from MESO output cell 1005 to conductor 211b is off. In this example, ferroelectric 206b of MESO input cells 1001, 1002, and 1003 switches from –QF to +QF due to positive current $I_{charge(IN)}$ along the x-axis. Note, depending on the direction of input charge current on conductors 211a, the ferroelectric 206b may switch differently. For example, ferroelectric 206b of MESO input cells 1001, 1002, and 1003 switches from +QF to –QF due to negative current $I_{charge}(IN)$ along the –x axis. The ferroelectric 206a of MESO output cell 1005 may get charged according to the effective direction of current in conductor 1004. However, since $V_{clk2}=0$, the output of MESO cell 1005 is not determined yet.

During time t1 after t0, $V_{clk1}=0$ and $V_{clk2}=1$, a DC current path exists from Vdd of MESO stage 1005 to ground of MESO stage 1005. This allows the MESO output cell 1005 to generate ISOC current at 202b, 203b and 204b stack and provide the minority logic function output to the next stage.

When high phases of $V_{CLK1}$ and $V_{CLK2}$ overlap, MESO input cells 1001, 1002, and 1003 drive MESO 1005 and generates an input current to MESO 1005 based on the summation of output currents on interconnect 1004. The minority function is completed by MESO output cell 1005, where its state follows the minority among states of MESO input cells 1001, 1002, and 1003. In some embodiments, all MESO devices are in the interconnect metal layer of a die, whereas the n-type transistors (for signaling) are in the transistor layer or active region of the die. For example, all MESO devices are formed in the backend of the die while the transistors are formed in the frontend of the die.

While two clocks are shown for MESO device 1000, more than two clocks may be used. For example, each MESO input cell may operate on its own clock such that there is small overlap between the clocks of the MESO input cells.

Figure 13:
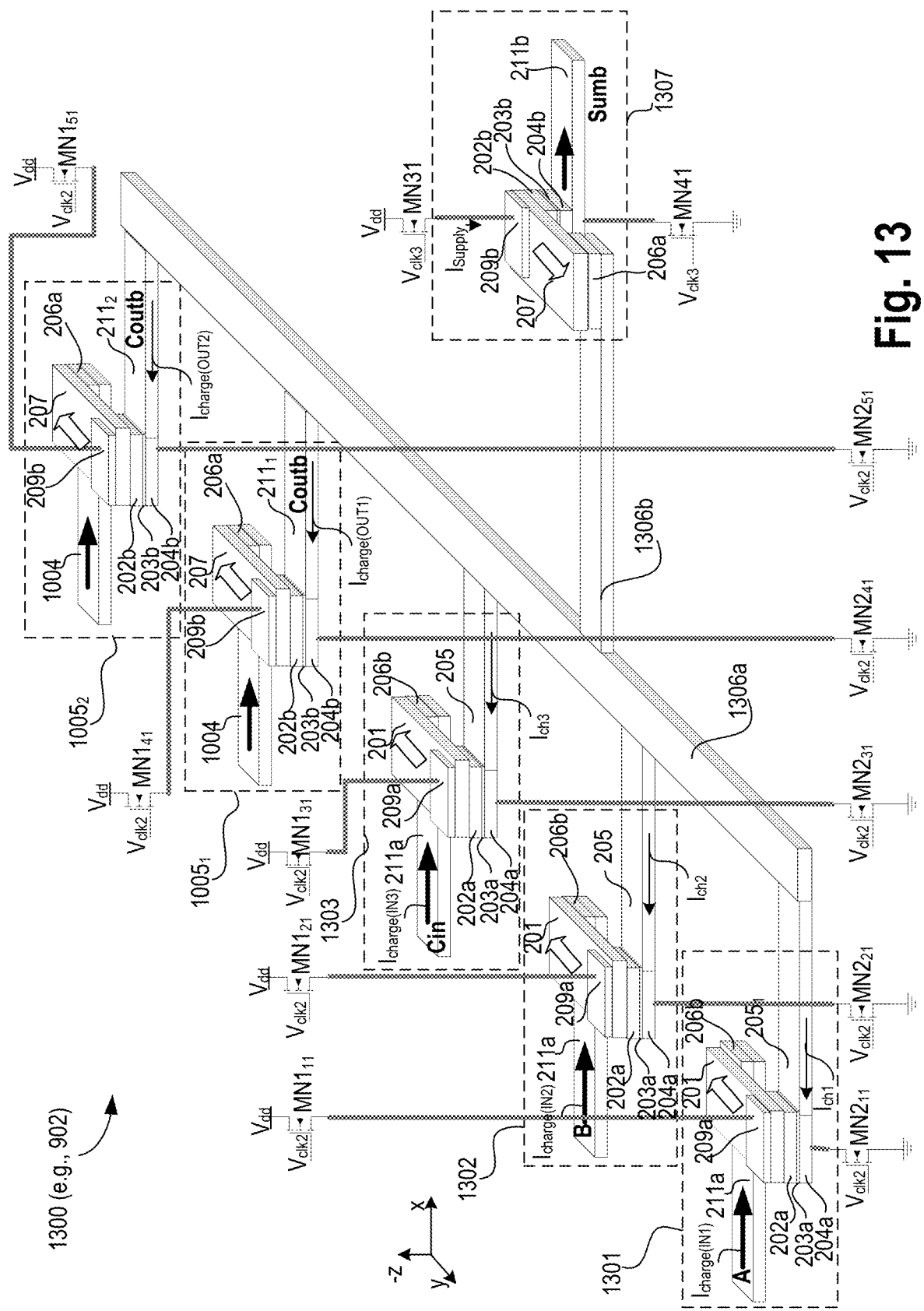
FIG. 13 illustrate a 5-input MESO gate for sum generation, in accordance with some embodiments.

FIG. 13 illustrates a 5-input MESO gate for sum generation 1300 (e.g., 902), in accordance with some embodiments. As discussed with reference to adder architecture 900, here sum generation structure 1300 is shown with part of the output of the MESO gate for carry generation structure 1200. For example, MESO cells 1005$_1$ and 1005$_2$ are the output MESO cells 1005 of carry generation structure 1200. While one output MESO cell 1005 is shown in the carry generation structure 1200, another MESO cell (same as 1005) can be coupled to interconnect 1004 to provide another Coutb output for use in the sum generation structure 1300.

To enable proper minority logic gate function for the 5-input MESO gate for sum generation 1300 and to avoid backward propagation of charge from output MESO cell 1307 to the input MESO cells 1301, 1302, 1303, 1005$_1$, and 1005$_2$ a two-phase clocking scheme is employed as described with reference to FIGS. 2-6. Here, MESO cell 1005$_1$ (e.g., 1005 of FIG. 10 and FIG. 12) is a copy of MESO cell 1005 and is also coupled to summing interconnect 1004. Likewise, MESO cell 1005$_2$ is a copy of MESO cell 1005$_1$ and is also coupled to summing interconnect 1004. In some embodiments, n-type transistors MN1 (e.g., MN1$_{11}$, MN1$_{21}$, MN1$_{31}$, MN1$_{41}$, and MN151) and MN2 (e.g., MN2$_{11}$, MN2$_{21}$, MN2$_{31}$, MN2$_{41}$, and MN2$_{51}$), controllable by clock 2 ($V_{CLK2}$) are used to control the propagation of input charge current to output conductor 205 (e.g., interconnects 1306$a$/$b$), while n-type transistors MN31 and MN41, controllable by clock 3 ($V_{CLK3}$) are used to control the propagation of the summed charge current at 1306$a$/$b$ and generation of output Sumb to output conductor 211$b$.

For example, for MESO input cell 1301, the input magnet 201 is coupled to supply Vdd via contact 209$a$ and n-type transistor MN1$_{11}$ controllable by $V_{CLK2}$ while one of the SOC stack layers 204$a$ is coupled to ground via n-type transistor MN2$_{11}$ controllable by $V_{CLK2}$. For MESO input cell 1302, the input magnet 201 is coupled to supply Vdd via contact 209$a$ and n-type transistor MN1$_{21}$ controllable by $V_{CLK2}$ while one of the SOC stack layers 204$a$ is coupled to ground via n-type transistor MN2$_{21}$ controllable by $V_{CLK2}$. For MESO input cell 1303, the input magnet 201 is coupled to supply $V_{dd}$ via contact 209$a$ and n-type transistor MN1$_{31}$ controllable by $V_{CLK2}$ while one of the SOC stack layers 204$a$ is coupled to ground via n-type transistor MN2$_{31}$ controllable by $V_{CLK2}$.

The other input MESO cells are 1005$_1$ and 1005$_2$ are output cells of the 3-input MESO carry generation structure 1000/1200. As discussed herein, MESO cell 1005$_1$ (e.g., 1005 of FIG. 10 and FIG. 12) is a copy of MESO cell 1005, where its input conductor is coupled to the summing interconnect 1004 in the previous stage and its output conductor 211$_1$ is coupled to the summing interconnect 1306$a$/$b$. Likewise, MESO cell 1005$_2$ is a copy of MESO cell 1005$_1$, where its input conductor is coupled to the summing interconnect 1004 in the previous stage and its output conductor 2112 is coupled to the summing interconnect 1306$a$/$b$. For MESO cell 1005$_1$, magnet 207 is coupled to supply $V_{dd}$ via contact 209$b$ and n-type transistor MN1$_{41}$ (e.g., MN3) controllable by $V_{CLK2}$ while one of the SOC stack layers 204$b$ is coupled to ground via n-type transistor MN2$_{41}$ (e.g., MN4) controllable by $V_{CLK2}$. For MESO input cell 1005$_2$, the magnet 207 is coupled to supply $V_{dd}$ via contact 209$b$ and n-type transistor MN1$_{51}$ controllable by $V_{CLK2}$ while one of the SOC stack layers 204$b$ is coupled to ground via n-type transistor MN2$_{51}$ controllable by $V_{CLK2}$.

For MESO output cell 1307, the output magnet 207 is coupled to supply $V_{dd}$ via contact 209$b$ and n-type transistor MN31 controllable by $V_{CLK3}$ while one of the SOC stack layers 204$b$ is coupled to ground via n-type transistor MN41 controllable by $V_{CLK3}$. The two clocks $V_{CLK2}$ and $V_{CLK3}$ may have different phases, non-overlapping phases, or slightly overlapping phases. Any overlap in the phases of two clocks $V_{CLK2}$ and $V_{CLK3}$ is small enough to cause proper propagation of charge current without backward propagation of charge current.

During time t0, $V_{clk2}=1$ and $V_{clk3}=0$, $I_{SUPPLY}$ of MESO inputs cells 1301, 1302, and 1303, and cells 1005$_1$ and 1005$_2$ is on while $I_{SUPPLY}$ of MESO output cell stage 1307 is off. The ferroelectric 206$b$ in MESO input cells 1301, 1302, and 1303, and ferroelectric 206$a$ of cells 10051 and 10052 have a transient current path from the input driver $V_{DD}$ to the ground, while the transient conduction path from MESO output cell 1307 to conductor 211$b$ is off. In this example, ferroelectric 206$b$ of MESO input cells 1301, 1302, and 1303, and ferroelectric 206$a$ of cells 10051 and 10052 have switches from −QF to +QF due to positive current $I_{charge}(I_N)$ along the x-axis.

Note, depending on the direction of input charge current on conductors 211$a$ and 205$_{3-4}$, the ferroelectric 206$b$ and 206$a$ of cells 1301, 1302, 1303, 1005$_1$ and 1005$_2$ may switch differently. For example, ferroelectric 206$b$ of MESO input cells 1301, 1302, and 1303 switches from +QF to −QF due to negative current $I_{charge(IN)}$ along the −x axis. The ferroelectric 206$a$ of MESO output cell 1307 may get charged according to the effective direction of current in conductor 1306$a$/$b$. However, since $V_{clk3}=0$, the output of MESO cell 1307 is not determined yet.

During time t1 after t0, $V_{clk3}=0$ and $V_{clk2}=1$, a transient current path exists from $V_{dd}$ of MESO stage 1307 to ground of MESO stage 1307. This allows the MESO output cell 1307 to provide the minority logic function output Sumb to the next MESO stage.

When phases of $V_{CLK2}$ and $V_{CLK3}$ overlap, MESO cells 1301, 1302, 1303, 1005$_1$ and 1005$_2$ drive MESO 1307 and generates an input current to MESO 1307 based on the summation of output currents on interconnect 1306$a$/$b$. The minority function is completed by MESO output cell 1307, where its state follows the minority among states of MESO cells 1301, 1302, 1303, 1005$_1$ and 1005$_2$.

While two clocks are shown for MESO device 1300, more than two clocks may be used. For example, each MESO input cell may operate on its own clock such that there is small overlap between the clocks of the MESO input cells.

Figure 14A:
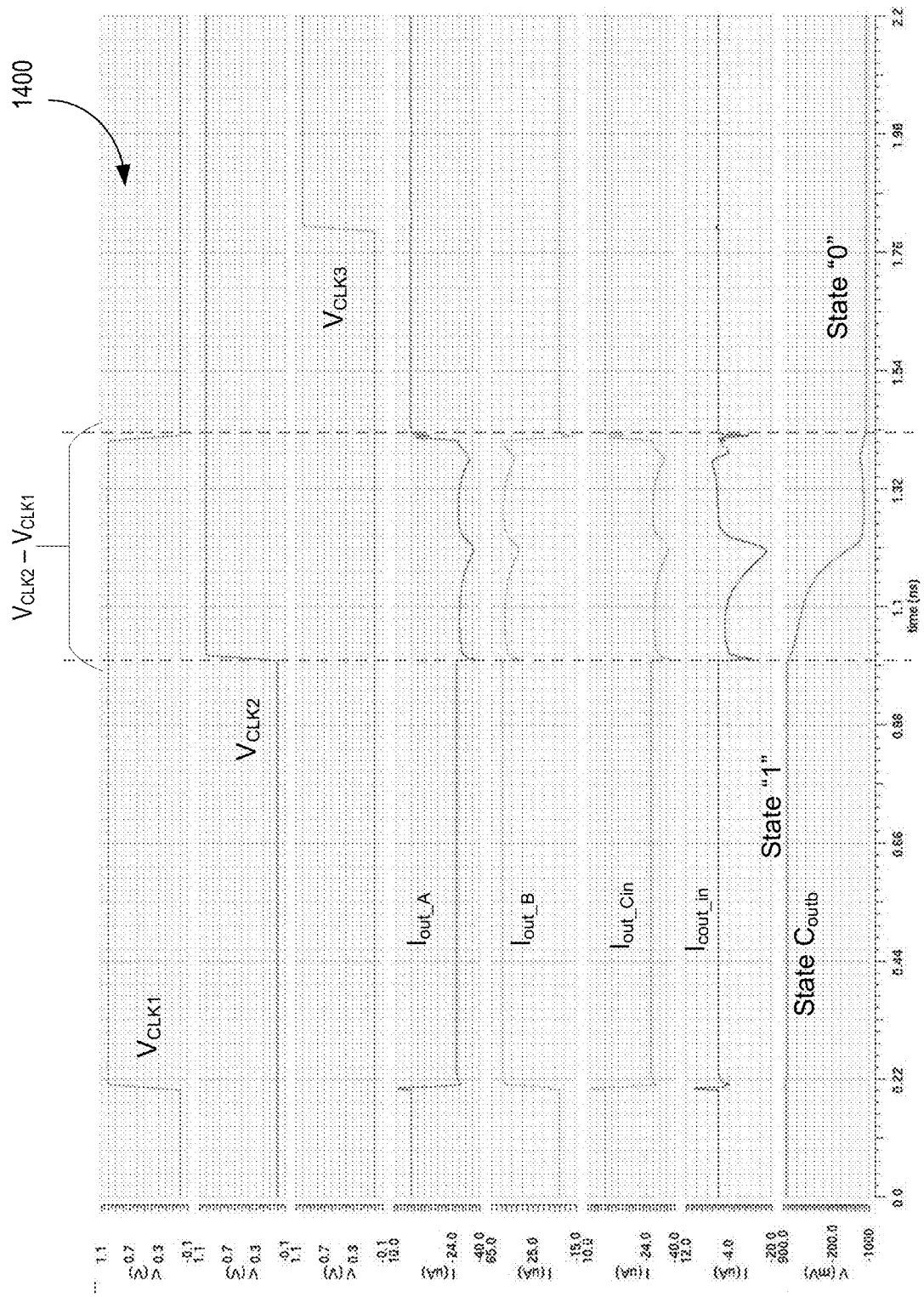
FIGS. 14A-C illustrate simulation results of the 1-bit MESO adder, in accordance with some embodiments.
Figure 14B:
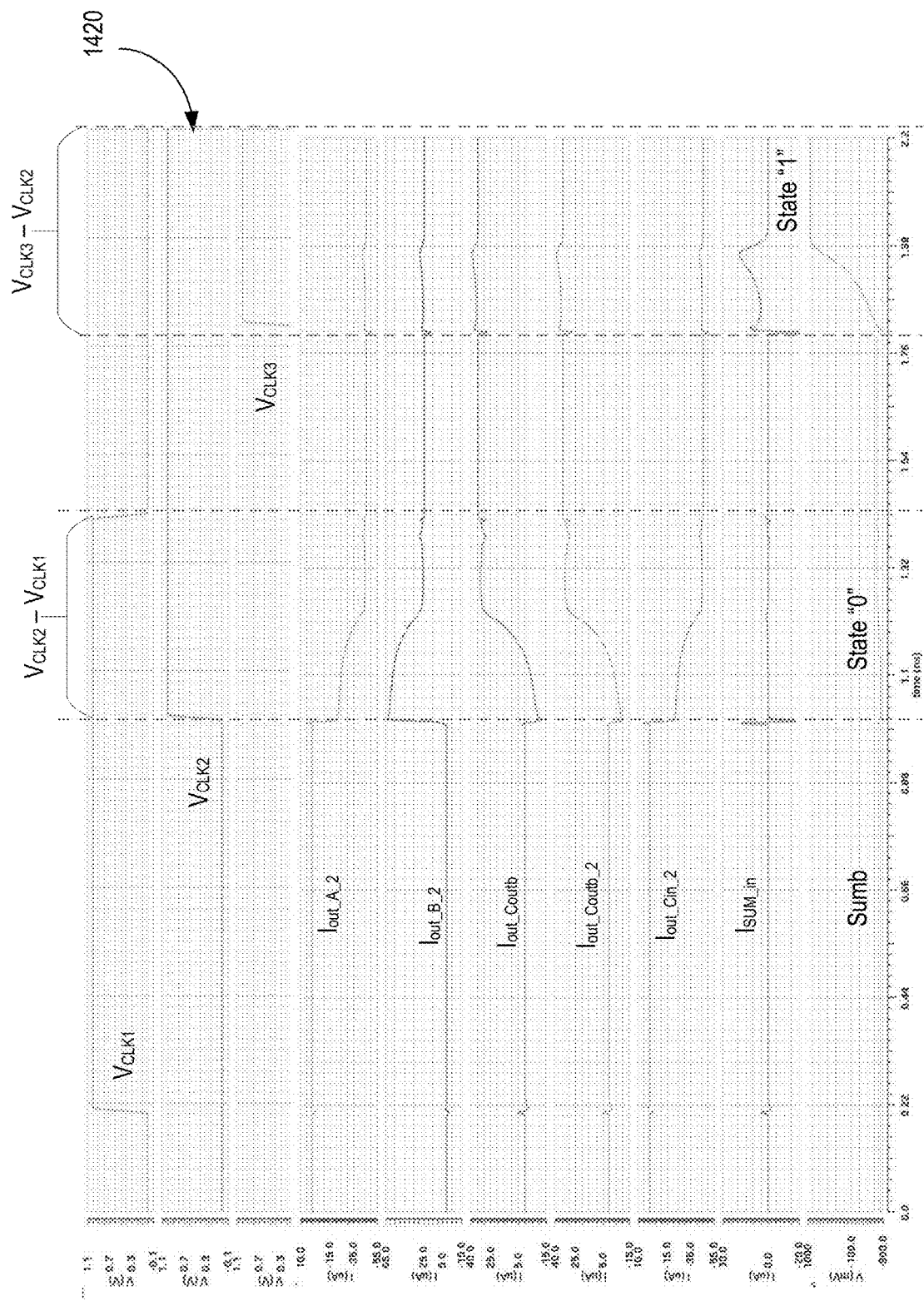
Figure 14C:
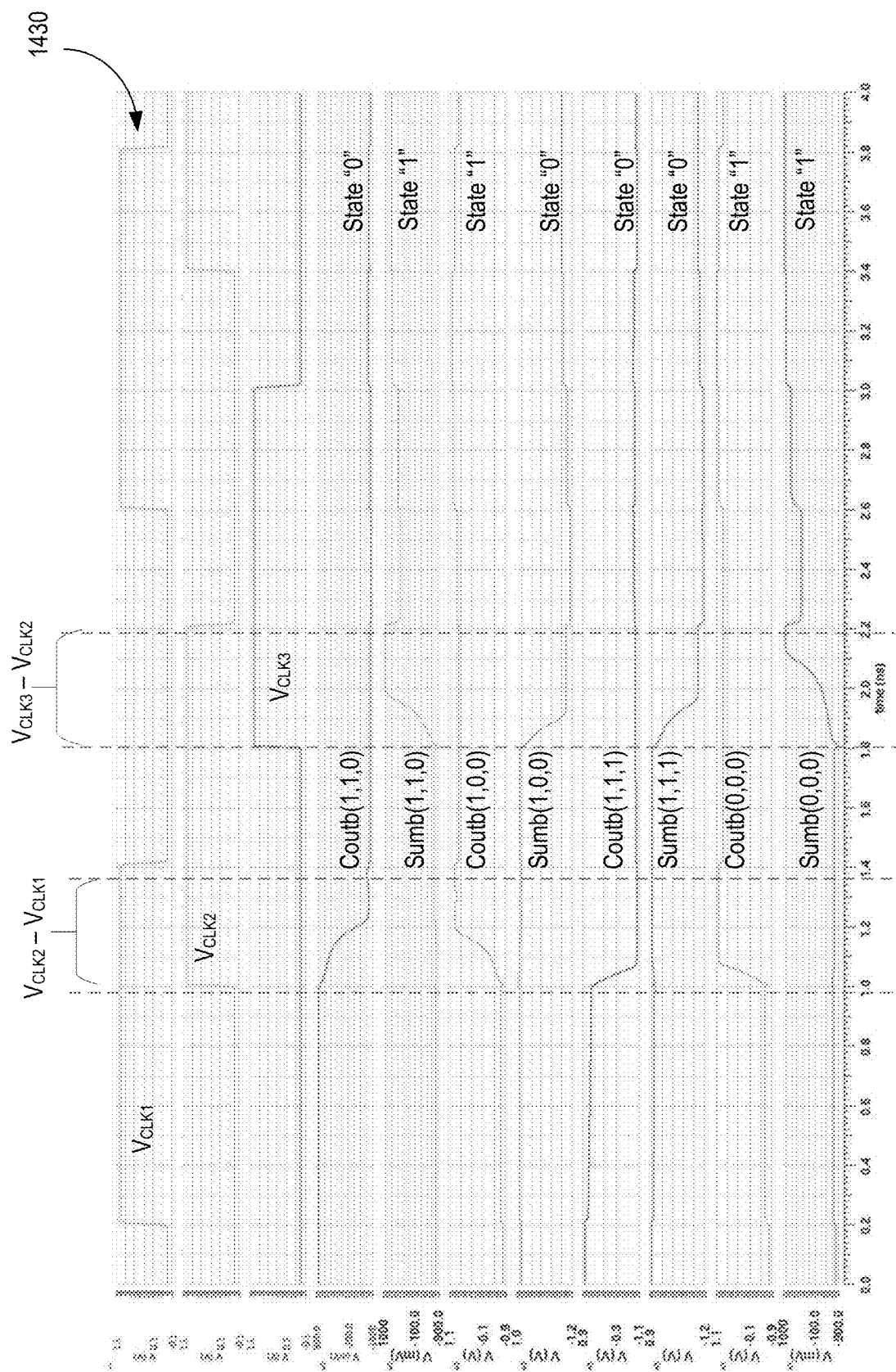

FIGS. 14A-C illustrate simulation results in plots 1400, 1420, and 1430, respectively, of the 1-bit MESO adder 900 (e.g., devices of 1200 and 1300 together), in accordance with some embodiments. In this example, the clock period is 2.4 ns (nanoseconds), fall and rise time is 10 ps (picoseconds), 1.2 ns phase of 1 V (Volts). The overlap of every 2 clock is 400 ps. $V_{DD}$ is 200 mV (milli Volt), where the MESO ferroelectric polarization charge is 1.6 fC (ferro Coulomb) per MESO device. Here, simulation results are for 1-bit adder operation for input condition of {A=1, B=0, Cin=1} are shown. The input currents for the 3-input minority gate 1200 (e.g., 901) and 5-input minority gate 1300 (e.g., 903) are shown, respectively.

FIG. 14A illustrates carry generation including the 3-phase clock signals, output currents from the first stage A, B, Cin ($I_{out\_A}$, $I_{out\_B}$ and $I_{out\_Cin}$), input current $I_{cout\_in}$ to the first stage 3-input minority gate, Coutb generation (state change) at $V_{CLK1}$-$V_{CLK2}$ overlap. When $V_{CLK1}$ and $V_{CLK2}$ overlap, the first stage inputs A and Cin generate discharging current (negative) $I_{out\_A}$ and $I_{out\_Cin}$ while input B generates a charging current (positive) $I_{out\_B}$. The summation of the current is $I_{COUT\_in}$ and deposits negative charge at the 3-input MESO gate's ferroelectric capacitor, switching it to "0" Coutb state.

FIG. 14B illustrates sum generation including the output currents from second stage A, B, Cin($I_{out\_A\_2}$, $I_{out\_B\_2}$ and $I_{out\_Cin\_2}$) and two Coutb ($I_{out\_Cout\_b}$, and $I_{out\_Cout\_b\_2}$), input current $I_{SUM\_in}$ to the second stage 5-input minority gate, and the Sumb generation (stage change) at $V_{CLK2}$-$V_{CLK3}$ overlap. When $V_{CLK2}$ and $V_{CLK3}$ overlap, the second stage A, B, Cin, Coutb and Coutb generate discharging current $I_{out\_A\_2}$, $I_{out\_Cin\_2}$ and charging current $I_{out\_B\_2}$, $I_{out\_Cout\_b}$, and $I_{out\_Cout\_b\_2}$, hence producing a charging current $I_{SUM\_in}$ and switching the 5-input MESO gate to "0", which is the expected Sumb state.

FIG. 14C shows the simulation waveform of Coutb and Sumb state change for input conditions of (A=1, B=1, Cin=0), (A=1, B=0, Cin=0), (A=1, B=1, Cin=1) and (A=0, B=0, Cin=0). Since the input condition A, B and Cin are interchangeable in minority gates, all combinations of A, B and Cin in adder operation are addressed in this plot.

Figure 15:
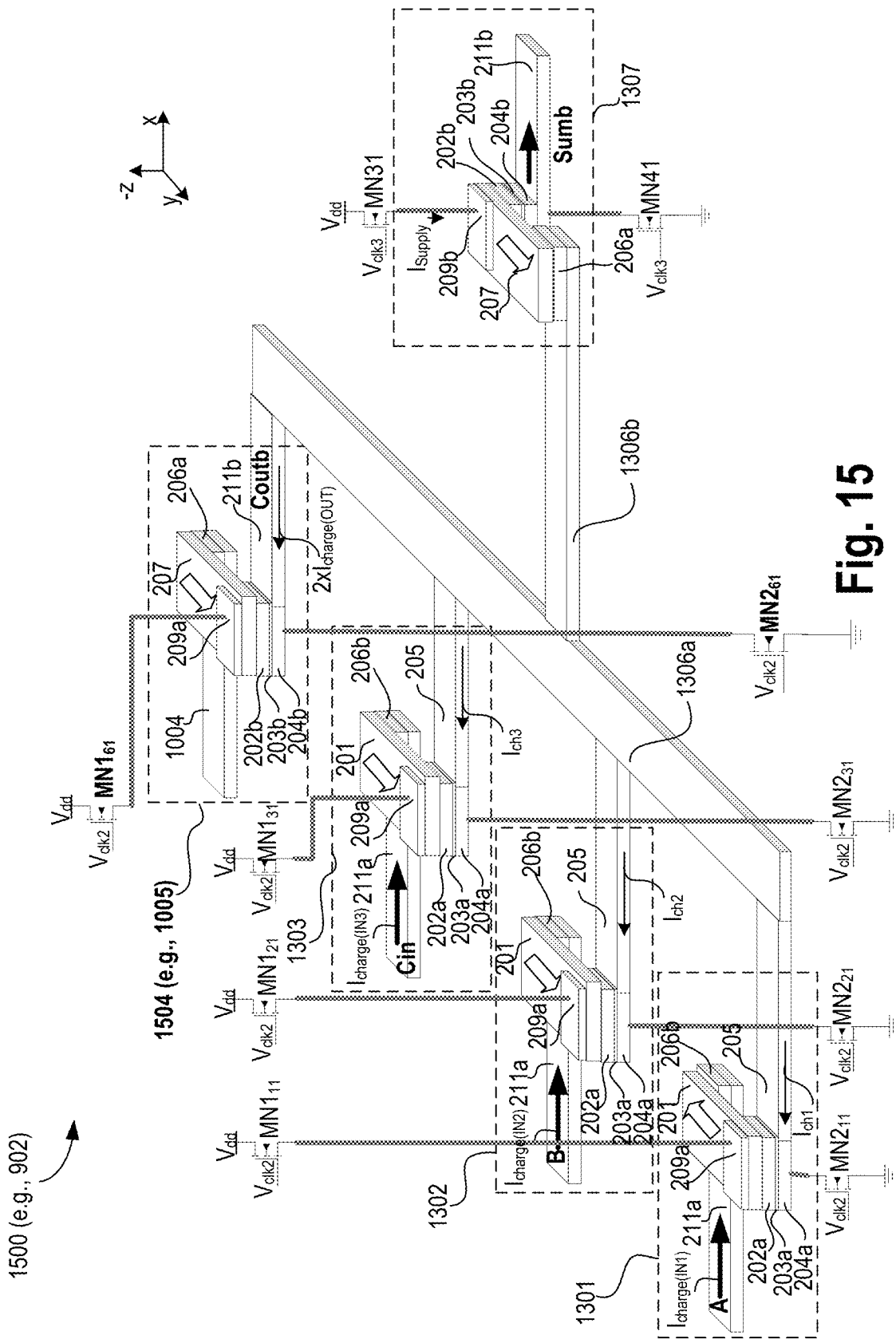
FIG. 15 illustrates a 4-input MESO gate for sum generation, in accordance with some embodiments.

FIG. 15 illustrates 4-input MESO gate 1500 (e.g., 902) for sum generation, in accordance with some embodiments. Transistors coupled to the MESO cell that received MESO $I_{ISOC}$ current is determined by spin to charge conversion efficiency η and the supply current Is, hence, by engineering the MESO material or sizing the transistor, the minority gate drive strength can be improved by 2× and the additional 3-input minority gate for Coutb generation can be eliminated, in accordance with some embodiments.

Compared to MESO gate 1300, here, one of two MESO devices 1005$_{1-2}$ is removed. As such, the remaining MESO device of the two MESO devices 1005$_{1-2}$ is coupled to driving transistors that provide twice as much current than just transistors MN3 and MN4 of FIG. 12. For example, transistors MN1$_{61}$ and MN2$_{61}$ that are coupled to layers 209a and 204b, respectively, of MESO cell 1504 are twice as large than the transistors MN1$_{11}$ and MN2$_{11}$ of FIG. 12, where transistors MN1$_{11}$ and MN2$_{11}$, MN1$_{21}$ and MN2$_{21}$, MN1$_{31}$ and MN2$_{31}$ are the same size. In one instance, when transistors are FinFET transistors, transistors MN1$_{61}$ and MN2$_{61}$ have twice as many fins than the transistors MN1$_{11}$ and MN2$_{11}$ of FIG. 12, where transistors MN1$_{11}$ and MN2$_{11}$, MN1$_{21}$ and MN2$_{21}$, MN1$_{31}$ and MN2$_{31}$ have same number of fins.

Figure 16:
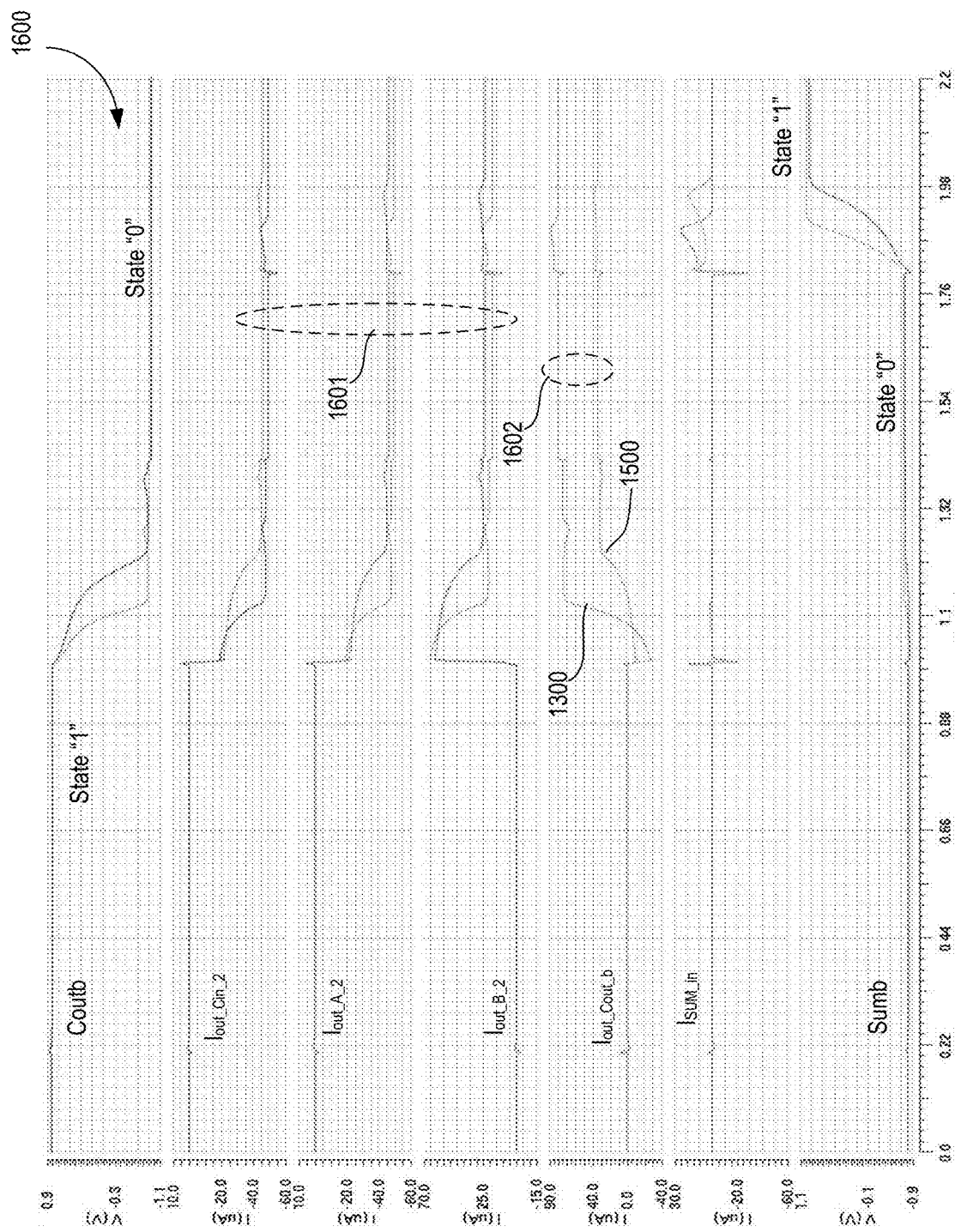
FIG. 16 illustrates a plot showing simulation results of the 4-input MESO gate of FIG. 15, in accordance with some embodiments.

FIG. 16 illustrates plot 1600 showing simulation results of the 4-input MESO gate of FIG. 15, in accordance with some embodiments. Simulation results of plot 1600 shows that the 1× Coutb generation of apparatus 1300 of FIG. 13 and 2× Coutb generation in apparatus 1500 of FIG. 15 illustrates the same function for Sumb output. Here, 1601 illustrates similar output currents for apparatus 1300 and 1500, and 1602 shows that the current for apparatus 1500 that generates Coutb is 2× more than the current for apparatus 1300 that generates Coutb.

Figure 17:
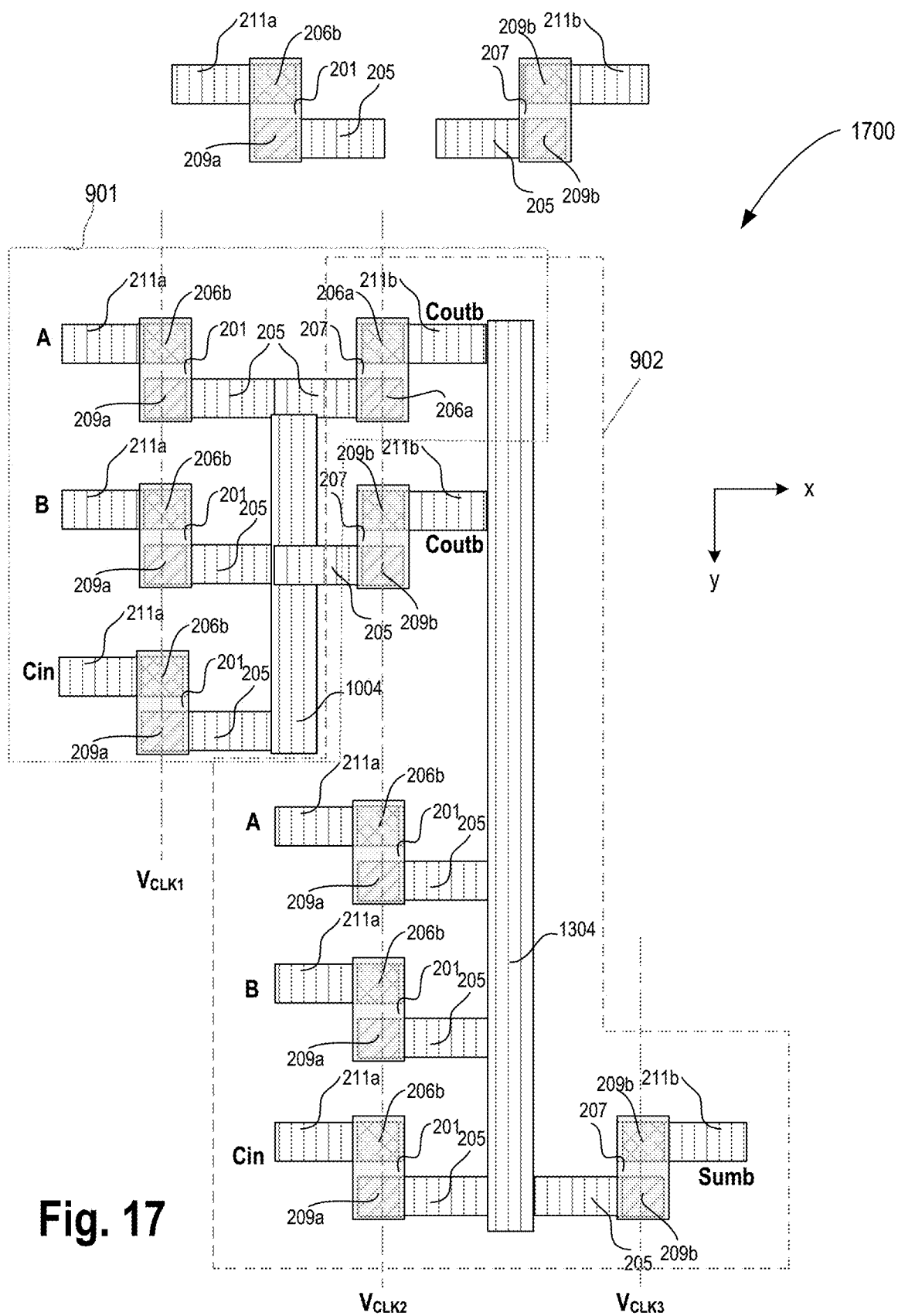
FIG. 17 illustrates a layout view (top view) of a 1-bit MESO full adder, in accordance with some embodiments.

FIG. 17 illustrates a layout view (top view) 1700 of a 1-bit MESO full adder 900 (e.g., combined apparatuses 1200 and 1300), in accordance with some embodiments.

Figure 18:
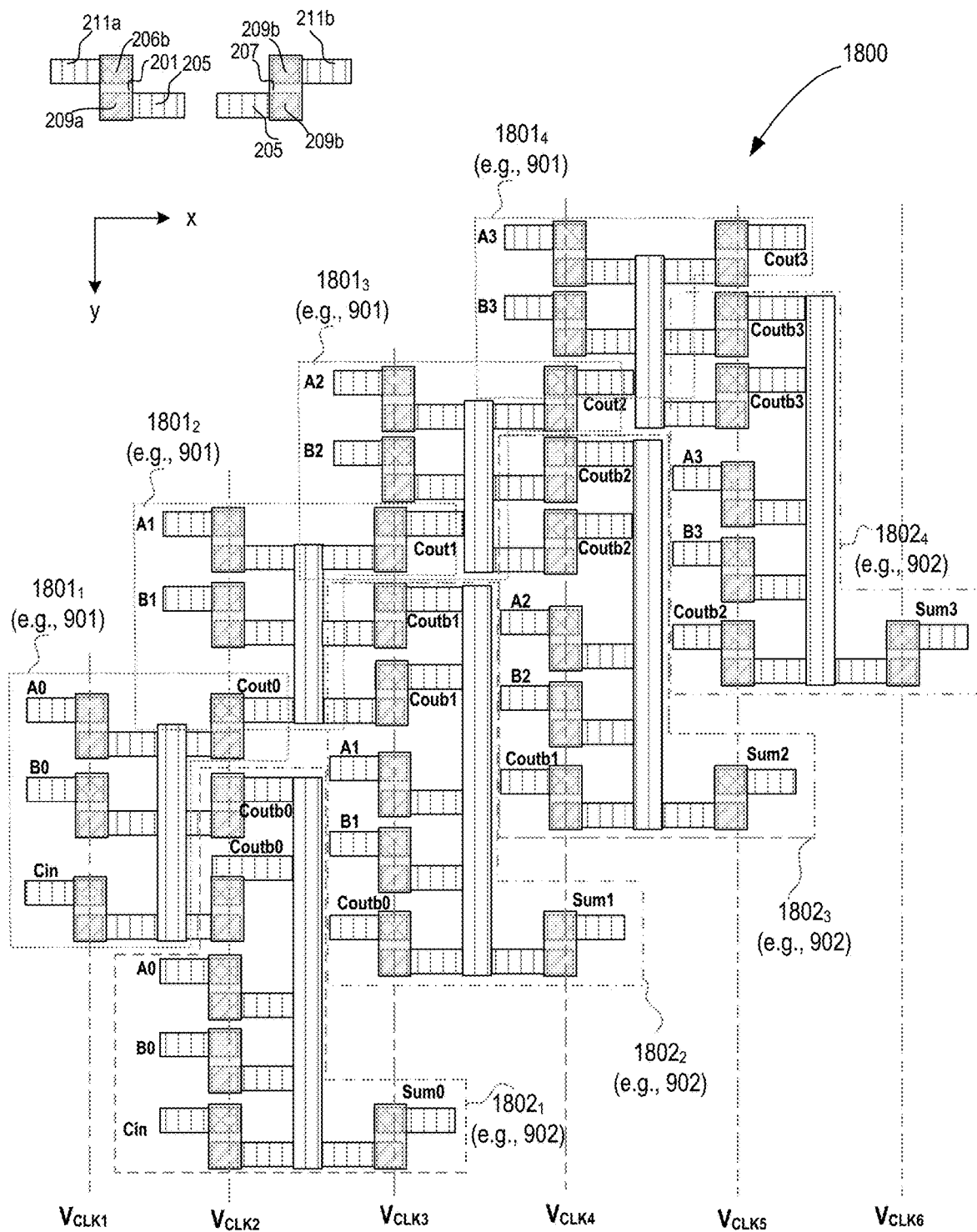
FIG. 18 illustrates a layout (top view) of a 4-bit MESO full adder using 5-input MESO gates for sum generation, in accordance with some embodiments.

FIG. 18 illustrates a layout (top view) 1800 of a 4-bit MESO full adder using 5-input MESO gates for sum generation, in accordance with some embodiments. Here, MESO 1-bit adder 900 (e.g., combined apparatuses 1200 and 1300) is expanded to a 4-bit ripple carry full adder comprising MESO carry generation structures 1801$_{1-4}$ and MESO sum generation structures 1802$_{1-4}$.

Depending on the supply current direction, the output current of MESO cell can be the same or the opposite direction of the input current. As such, by changing the $V_{dd}$ and ground connection of the transistors for a certain MESO device or cell, either minority or majority gate function can be achieved. In some embodiments, in carry and sum generation operations, either Coutb and Sumb ($V_{dd}$ and ground is the same as the previous stage) or Cout and Sum ($V_{dd}$ and ground connection is altered comparing to the previous MESO stage). The 1-bit full adder provides Cout and Sum (instead of Coutb and Sumb) when the corresponding output minority gates have Vdd and ground connections altered or have negative Vdd. The generated Cout from the first stage and the input from the second stage (A1, B1) form the three inputs of the second bit full adder (the first bit Coutb has a metal connection to the input of the second bit 5-input minority gate which is not shown in the figure). Therefore, a ripple carry adder operation is obtained by cascading the 1-bit full adder and expanding to a 4-bit design or multi-bit design.

For proper ripple carry operation and to avoid backward propagation, six clocks $V_{CLK1}$, $V_{CLK2}$, $V_{CLK3}$, $V_{CLK4}$, $V_{CLK5}$, and $V_{CLK6}$ are used for the various cascaded stages of MESO devices. In various embodiments, clocks $V_{CLK1}$, $V_{CLK2}$, $V_{CLK3}$, $V_{CLK4}$, $V_{CLK5}$, and $V_{CLK6}$ have different phases. In some embodiments, phases of clocks $V_{CLK1}$ and $V_{CLK2}$ have a portion of overlapping phases, phases of clocks $V_{CLK2}$ and $V_{CLK3}$ have a portion of overlapping phases, phases of clocks $V_{CLK3}$ and $V_{CLK4}$ have a portion of overlapping phases, phases of clocks $V_{CLK4}$ and $V_{CLK5}$ have a portion of overlapping phases, and phases of clocks $V_{CLK5}$ and $V_{CLK6}$ have a portion of overlapping phases. As such, Cout0 (or Coutb0) is generated upon assertion of $V_{CLK2}$, Sum0 (or Sumb0) is generated upon assertion of $V_{CLK3}$, Cout1 (or Coutb1) is generated upon assertion of $V_{CLK3}$, Sum1 (or Sumb1) is generated upon assertion of $V_{CLK4}$, Cout2 (or Coutb2) is generated upon assertion of $V_{CLK4}$, Sum2 (or Sumb2) is generated upon assertion of $V_{CLK5}$, Cout3 (or Coutb3) is generated upon assertion of $V_{CLK5}$, and Sum3 (or Sumb3) is generated upon assertion of $V_{CLK6}$. Also, $V_{CLK4}$, $V_{CLK5}$, and $V_{CLK6}$ can be the same as $V_{CLK1}$, $V_{CLK2}$ and $V_{CLK3}$, respectively, since 3-phase clock can provide isolation between MESO stages to prevent back-propagation effect. In that case, only 3 clocks are used for multiple adder stages.

Figure 19:
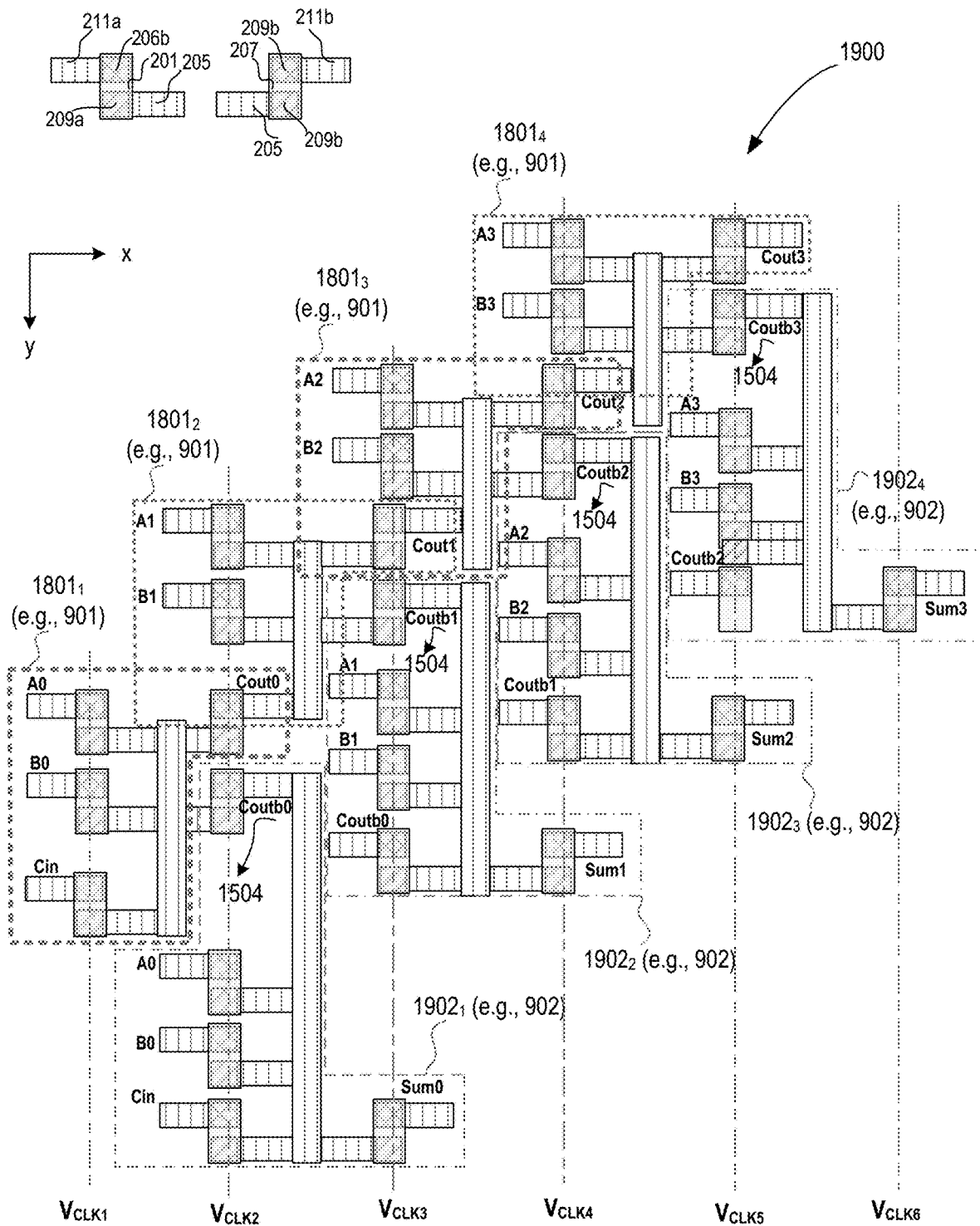
FIG. 19 illustrates a layout (top view) of a 4-bit MESO full adder using 4-input MESO gates for sum generation, in accordance with some embodiments.

FIG. 19 illustrates a layout (top view) 1900 of a 4-bit MESO full adder using 4-input MESO gates for sum generation, in accordance with some embodiments. Layout 1900 shows the 1-bit MESO full adder layout of FIG. 15 with 2× transistor sizing for Coutb generation and corresponding 4-bit full adder, respectively. For more stages (e.g. 8-bit, 16-bit or more), similar connection scheme can be applied and more clocks can be used to ensure proper cascading of MESO logic cells. Designs of FIG. 13 and FIG.

15 use four and three MESO devices per bit, respectively, with other six MESO devices from the previous output stage. Here, MESO 1-bit adder 900 (e.g., combined apparatuses 1200 and 1500) is expanded to a 4-bit ripple carry full adder comprising MESO carry generation structures $1801_{1-4}$ and MESO sum generation structures $1902_{1-4}$. In this case, Coutb0 (or Cout0), Coutb1 (or Cout1), Coutb2 (or Cout2), and Coutb3 (or Cout3) are produced by twice as large drive transistors as discussed with reference to MESO cell 1504. Cout or Coutb and Sum or Sumb depend on the supply and ground connections to 209a and 204a or have negative Vdd as described in 1800. The various clocks described with reference to FIG. 18 are also applied here.

Figure 20:
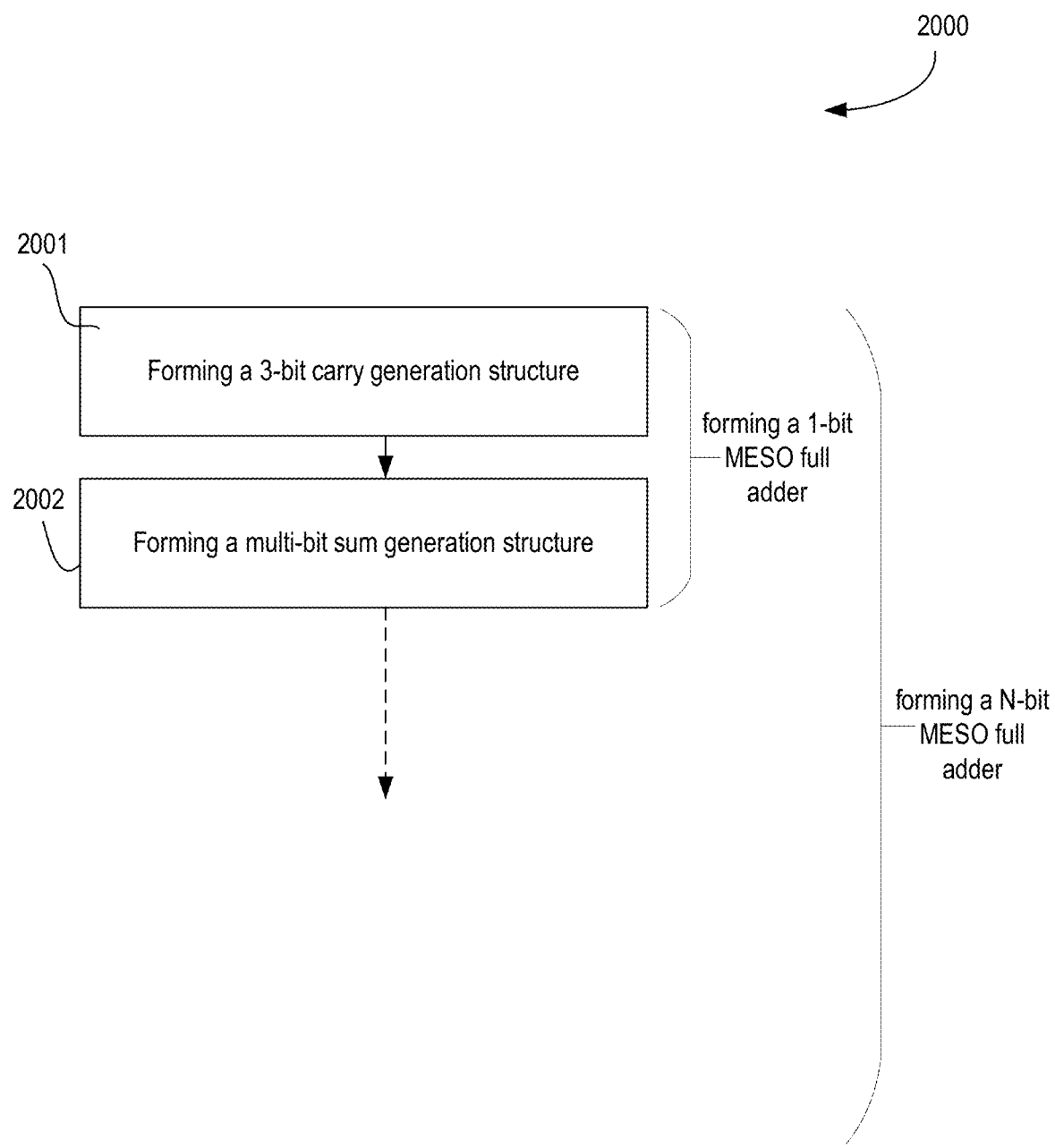
FIG. 20 illustrates a method flowchart for forming a 1-bit MESO full adder, in accordance with some embodiments.

FIG. 20 illustrates a method flowchart 2000 for forming a 1-bit MESO full adder, in accordance with some embodiments. At block 2001, a 3-bit carry generation structure (e.g., 901, 1200) is formed including at least three cells (e.g., 1001, 1002, and 1003) comprising magnetoelectric material and spin orbit material, wherein the 3-bit carry generation structure is to perform a minority logic operation on first A, second B, and third Cin inputs to generate a carry output (Coutb or Cout depending on the connections of Vdd and ground).

At block 2002, a multi-bit sum generation structure (e.g., 902, 1300, 1500) including at least three cells (e.g., 1301, 1302, and 1303, $1005_{1-2}$ or 1504, where $1005_{1-2}$ or 1504 can be part of 3-bit carry generation structure 1200) comprising magnetoelectric material and spin orbit material, wherein the carry output of the 3-bit carry generation structure is coupled to an input of the multi-bit sum generation structure, and wherein the multi-bit sum generation structure is to perform a minority logic operation on the first, second, and third inputs and the carry output to generate a sum output. Here, a 1-bit adder is formed by blocks 2001 and 2002 together. To form multiple bit adders (e.g., N-bit adder), blocks 2001 and 2002 are repeated and MESO cells coupled together as described with reference to FIGS. 13-19.

Figure 21:
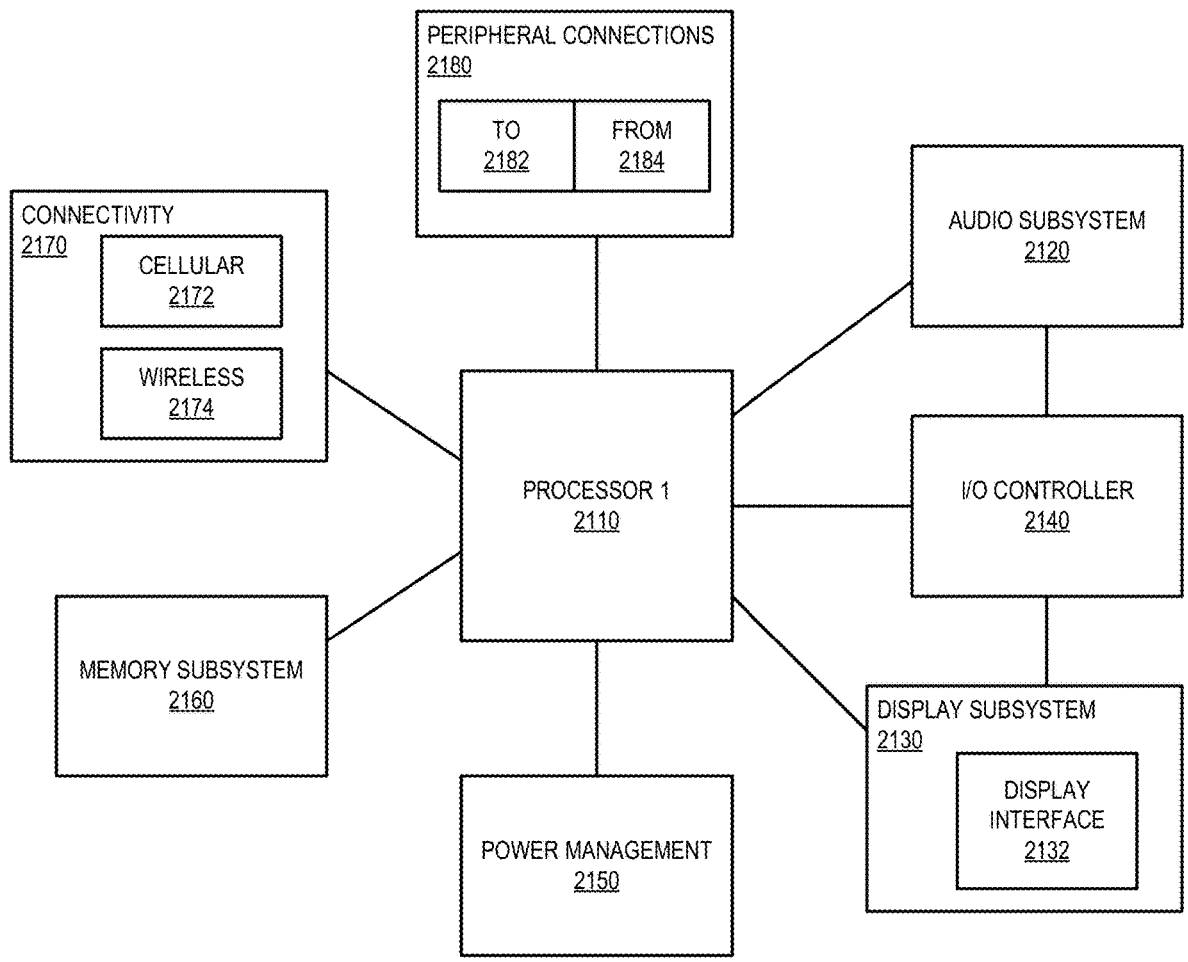
FIG. 21 illustrates a smart device or a computer system or a SoC (System-on-Chip) with a MESO full adder, according to some embodiments.

FIG. 21 illustrates a smart device or a computer system or a SoC (System-on-Chip) with a MESO full adder, according to some embodiments. FIG. 21 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes first processor 2110 with MESO full adder, according to some embodiments discussed. Other blocks of the computing device 2100 may also include a MESO full adder, according to some embodiments. The various embodiments of the present disclosure may also comprise a network interface within 2170 such as a wireless interface so that a system embodiment may be incorporated into a wireless device, for example, cell phone or personal digital assistant.

In some embodiments, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In some embodiments, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

In some embodiments, computing device 2100 comprises display subsystem 2130. Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

In some embodiments, computing device 2100 comprises I/O controller 2140. I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In some embodiments, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In some embodiments, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 2100 comprises connectivity 2170. Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 2100 comprises peripheral connections 2180. Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a 3-bit carry generation structure including at least three cells comprising a magnetoelectric material and a spin orbit material, wherein the 3-bit carry generation structure is to perform a minority logic operation on first, second, and third inputs to generate a carry output; and
    a multi-bit sum generation structure including at least three cells comprising a magnetoelectric material and a spin orbit material, wherein the carry output of the 3-bit carry generation structure is received by the multi-bit sum generation structure, and wherein the multi-bit sum generation structure is to perform a minority logic operation on the first, second, and third inputs and the carry output to generate a sum output.

2. The apparatus of claim 1, wherein at least one cell of the at least three cells of the 3-bit carry generation structure comprises:
a magnet having a first portion and a second portion;
a stack of layers, a portion of which is adjacent to the first portion of the magnet, wherein the stack of layers comprises a spin orbit material;
a layer adjacent to the second portion, the layer comprising a magnetoelectric material;
a conductor adjacent to the layer;
a first device coupled to the magnet, wherein the first device is coupled to a first power supply node and is controllable by a clock; and
a second device coupled to a second supply node and to a layer of the stack of layers, wherein the second device is controllable by the clock.

3. The apparatus of claim 2, wherein the magnet is a first magnet, wherein the stack of layers is a first stack of layers, wherein the clock is a first clock, wherein the conductor is a first conductor, wherein the layer adjacent to the second portion of the first magnet is a first layer, wherein at least another cell of the at least three cells of the 3-bit carry generation structure comprises:
a second magnet having a first portion and a second portion;
a second stack of layers, a portion of which is adjacent to the first portion of the second magnet, wherein the second stack of layers comprises a spin orbit material;
a second layer adjacent to the second portion of the second magnet, the second layer comprising a magnetoelectric material;
a second conductor adjacent to the second layer and to a portion of the first stack of layers;
a third conductor adjacent to a portion of the second stack of layers;
a third device coupled to the second magnet, wherein the third device is coupled to the first power supply node and is controllable by a second clock; and
a fourth device coupled to the second supply node and to a layer of the second stack of layers, wherein the third device is controllable by the second clock.

4. The apparatus of claim 3, wherein the first clock has a first phase, wherein the second clock has a second phase, and wherein the first phase is different from the second phase.

5. The apparatus of claim 3, wherein the first, second, third, and fourth devices have the same conductivity type.

6. The apparatus of claim 3, wherein the first and third devices have a first conductivity type, and wherein the second and fourth devices have a second conductivity type.

7. The apparatus of claim 3, wherein the first layer and the second layer include one or more of: Cr, O, or a multiferroic material.

8. The apparatus of claim 7, wherein the multiferroic material includes one of: $BiFeO_3$, $LuFeO_2$, $LuFe_2O_4$, or La doped $BiFeO_3$, or wherein the multiferroic material includes one of: Bi, Fe, O, Lu, or La.

9. The apparatus of claim 7, wherein the first stack of layers and the second stack of layers comprise a material which includes one or more of: β-Ta, β-W, W, Pt, Cu doped with Iridium, Cu doped with Bismuth, or Cu doped an element of 3d, 4d, 5d, 4f, or 5f of periodic table groups.

10. The apparatus of claim 3, wherein the first and second magnets comprise a paramagnet or a ferromagnet, or wherein the first and second magnets comprises a material which includes one or more of: Pt, Pd, W, Ce, Al, Li, Mg, Na, Cr, O, Co, Dy, Er, Eu, Gd, Fe, Nd, K, Pr, Sm, Tb, Tm, or V.

11. The apparatus of claim 3, wherein the first and second magnets comprise one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, or Ru.

12. The apparatus of claim 2, wherein the multi-bit sum generation structure comprises a 5-input sum generation structure including three cells comprising a magnetoelectric material and a spin orbit material, wherein each of the three cells is coupled to a transistor having a same drive strength compared to transistors coupled to two of the at least three cells of the 3-bit carry generation structure that provide carry outputs.

13. The apparatus of claim 1, wherein the multi-bit sum generation structure comprises a 4-input sum generation structure including three cells comprising a magnetoelectric material and a spin orbit material, wherein transistors coupled to the 3-bit carry generation structure providing the carry output have twice a drive strength compared to a transistor coupled to another of the three cells of the multi-bit sum generation structure.

14. An apparatus comprising:
a first logic device including: a spin orbit material, a magnetostrictive material, and at least two transistors to operate using a first clock;
a second logic device including: a spin orbit coupling material, a magnetostrictive material, and at least two transistors to operate using the first clock;
a third logic device including: a spin orbit coupling material, a magnetostrictive material, and at least two transistors to operate using the first clock;
a fourth logic device coupled to the first, second and third logic devices, the fourth logic device including: a spin orbit coupling material, a magnetostrictive material, and at least two transistors to operate using a second clock; and
a fifth logic device coupled to the fourth logic device, the fifth logic device including: a spin orbit coupling material, a magnetostrictive material, and at least two transistors to operate using a third clock, wherein the first, second, and third clocks have different phases.

15. The apparatus of claim 14, wherein the first logic device is to receive a first variable input, wherein the second logic device is to receive a second variable input, wherein the third logic device is to receive a third input, and wherein the fourth logic device is to provide a carry output which is a minority function of the first and second variable inputs and the third input.

16. The apparatus of claim 15, wherein the fifth logic device is to receive the carry output, and wherein the fifth logic device is coupled to:
a sixth logic device to receive the first variable input, wherein the sixth logic device is coupled to the fifth logic device, and wherein the sixth logic device comprises a spin orbit material, a magnetostrictive material, and at least two transistors to operate using the second clock;
a seventh logic device to receive the second variable input, wherein the seventh logic device is coupled to the fifth logic device; and wherein the seventh logic device comprises a spin orbit material, a magnetostrictive material, and at least two transistors to operate using the second clock; and an eighth logic device to receive the third input, wherein the eighth logic device is coupled to the fifth logic device, and wherein the eighth logic device comprises a spin orbit material, a magnetostrictive material, and at least two transistors to operate using the second clock.

17. The apparatus of claim 14, wherein at least one of the magnetostrictive materials includes one or more of: Cr, O, or a multiferroic material.

18. The apparatus of claim 17, wherein the multiferroic material includes one of: $BiFeO_3$, $LuFeO_2$, $LuFe_2O_4$, or La doped $BiFeO_3$, or wherein the multiferroic material includes one of: Bi, Fe, O, Lu, or La.

19. The apparatus of claim 16, wherein at least one of the spin orbit materials includes one or more of: β-Ta, β-W, W, Pt, Cu doped with Iridium, Cu doped with Bismuth, or Cu doped an element of 3d, 4d, 5d, 4f, or 5f of periodic table groups.

20. A system comprising:
a memory;
a processor coupled to the memory, wherein the processor includes an adder which comprises:
 a 3-bit carry generation structure including at least three cells comprising a magnetoelectric material and a spin orbit material, wherein the 3-bit carry generation structure is to perform a minority logic operation on first, second, and third inputs to generate a carry output; and
 a multi-bit sum generation structure including at least four cells comprising a magnetoelectric material and a spin orbit material, wherein the carry output of the 3-bit carry generation structure is coupled to an input of the multi-bit sum generation structure, and wherein the multi-bit sum generation structure is to perform a minority logic operation on the first, second, and third inputs and the carry output to generate a sum output; and
a wireless interface to allow the processor to communicate with another device.

21. The system of claim 20, wherein at least one cell of the at least three cells of the 3-bit carry generation structure comprises:

a magnet having a first portion and a second portion;
a stack of layers, a portion of which is adjacent to the first portion of the magnet, wherein the stack of layers comprises a spin orbit material;
a layer adjacent to the second portion, the layer comprising a magnetoelectric material;
a conductor adjacent to the layer;
a first device coupled to the magnet, wherein the first device is coupled to a first power supply node and is controllable by a clock; and
a second device coupled to a second supply node and to a layer of the stack of layers, wherein the second device is controllable by the clock.

22. The system of claim 21, wherein the magnet is a first magnet, wherein the stack of layers is a first stack of layers, wherein the clock is a first clock, wherein the conductor is a first conductor, wherein the layer adjacent to the second portion of the first magnet, is a first layer, wherein at least another cell of the at least three cells of the 3-bit carry generation structure comprises:

a second magnet having a first portion and a second portion;
a second stack of layers, a portion of which is adjacent to the first portion of the second magnet, wherein the second stack of layers comprises a spin orbit material;
a second layer adjacent to the second portion of the second magnet, the second layer comprising a magnetoelectric material;
a second conductor adjacent to the second layer and to a portion of the first stack of layers;
a third conductor adjacent to a portion of the second stack of layers;
a third device coupled to the second magnet, wherein the third device is coupled to the first power supply node and is controllable by a second clock;
a fourth device coupled to the second supply node and to a layer of the second stack of layers, wherein the third device is controllable by the second clock.

23. The system of claim 22, wherein the first clock has a first phase, wherein the second clock has a second phase, and wherein the first phase is different from the second phase.

* * * * *